United States Patent
Seki et al.

(10) Patent No.: US 10,563,825 B2
(45) Date of Patent: Feb. 18, 2020

(54) LIGHT FLUX CONTROL MEMBER, LIGHT-EMITTING DEVICE AND ILLUMINATION DEVICE

(71) Applicant: Enplas Corporation, Saitama (JP)

(72) Inventors: Akinobu Seki, Saitama (JP); Masayo Takizawa, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 15/739,793

(22) PCT Filed: Jun. 24, 2016

(86) PCT No.: PCT/JP2016/068813
§ 371 (c)(1),
(2) Date: Dec. 26, 2017

(87) PCT Pub. No.: WO2017/002723
PCT Pub. Date: Jan. 5, 2017

(65) Prior Publication Data
US 2019/0011086 A1    Jan. 10, 2019

(30) Foreign Application Priority Data
Jun. 29, 2015  (JP) .................................. 2015-129864

(51) Int. Cl.
*F21K 9/232* (2016.01)
*F21V 5/04* (2006.01)
(Continued)

(52) U.S. Cl.
CPC ................ *F21K 9/232* (2016.08); *F21K 9/69* (2016.08); *F21V 5/04* (2013.01); *H01L 33/58* (2013.01); *F21V 3/0615* (2018.02); *G02B 5/02* (2013.01)

(58) Field of Classification Search
CPC .......... F21K 9/232; F21K 9/69; F21V 3/0615; F21V 5/04; G02B 5/02; H01L 33/58
(Continued)

(56) References Cited

U.S. PATENT DOCUMENTS

2012/0307513 A1* 12/2012 Li ....................... G02B 6/0045
362/555
2016/0186938 A1* 6/2016 Liao ......................... F21V 7/04
362/84

FOREIGN PATENT DOCUMENTS

JP    2012-48205 A    3/2012
JP    2012-160666 A   8/2012
(Continued)

OTHER PUBLICATIONS

International Search Report from International Application No. PCT/JP2016/068813 dated Sep. 20, 2016.

*Primary Examiner* — Anh T Mai
*Assistant Examiner* — Jessica M Apenteng
(74) *Attorney, Agent, or Firm* — Brundidge & Stanger, P.C.

(57) ABSTRACT

A portion of the light from the light emitted by a light-emitting element enters the entrance region, then, is reflected by the first reflective surface on the same side as this entrance region with respect to the optical axis serving as a boundary, and is caused to exit from the second reflective surface on this same side. Another portion of the light enters the entrance region, is reflected by the second reflective surface and the third reflective surface, in this order, on the same side as this entrance region with respect to the optical axis serving as the boundary, is then caused to exit from the connection surface on this same side, re-enters from the first reflective surface or the connection surface on the opposite
(Continued)

side with respect to the optical axis, and is then caused to exit from the second reflective surface on this opposite side.

8 Claims, 15 Drawing Sheets

(51) Int. Cl.
    *H01L 33/58*     (2010.01)
    *F21K 9/69*     (2016.01)
    *G02B 5/02*     (2006.01)
    *F21V 3/06*     (2018.01)

(58) Field of Classification Search
    USPC .......................................................... 362/84
    See application file for complete search history.

(56) References Cited

FOREIGN PATENT DOCUMENTS

| | | |
|---|---|---|
| JP | 2013-65574 A | 4/2013 |
| JP | 2014-524125 A | 9/2014 |
| JP | 2015/074502 A1 | 5/2015 |
| WO | 2014/082370 A1 | 6/2014 |

\* cited by examiner

LIGHT FLUX CONTROL MEMBER, LIGHT-EMITTING DEVICE AND ILLUMINATION DEVICE

TECHNICAL FIELD

The present invention relates to a light flux controlling member that controls a distribution of light emitted from a light-emitting element, and a light-emitting device and an illumination apparatus including the light flux controlling member.

BACKGROUND ART

In recent years, in view of energy saving and environmental conservation, illumination apparatuses (such as light-emitting diode lamps) using a light-emitting diode (hereinafter also referred to as "LED") as a light source have been increasingly used in place of incandescent lamps or fluorescent lamps. Conventional illumination apparatuses using LEDs as the light source, however, emits light only in the forward direction (the light emission direction from the light source), and cannot perform wide-range light emission unlike incandescent lamps or fluorescent lamps. Consequently, unlike incandescent lamps or fluorescent lamps, the conventional illumination apparatuses cannot illuminate a room over a wide range by utilizing the reflection light of the ceiling and walls.

To make the light distribution characteristics of the conventional illumination apparatuses using LEDs as the light source close to the light distribution characteristics of incandescent lamps or fluorescent lamps, it has been proposed to control the light distribution of light emitted from LEDs by a light flux controlling member (see, for example, PTL 1).

The light flux controlling member (light emission direction conversion device) disclosed in PTL 1 includes an incidence surface that is so disposed to face a light-emitting element and to intersect the optical axis of a light-emitting element (LED), a recessed emission surface disposed on the side opposite to incidence surface, and an inclined surface disposed on a lateral side so as to connect the incidence surface and the emission surface. In the light flux controlling member disclosed in PTL 1, the light emitted from the light-emitting element with a small emission angle with respect to the optical axis of the light-emitting element enters the light flux controlling member from the incidence surface, and then reaches a center portion of the emission surface without being reflected by other surfaces. Then, the light reaching the emission surface is emitted forward from a center portion of the emission surface. In addition, the light emitted from the light-emitting element with a large emission angle with respect to the optical axis of the light-emitting element enters the light flux controlling member from the incidence surface, and then reaches the external edge of the emission surface. The light reaching the emission surface is reflected by the light emission surface, and then emitted laterally or rearward from the inclined surface. In addition, the light having a still larger emission angle with respect to the optical axis of the light-emitting element enters the light flux controlling member from the light incidence surface, and then reaches the inclined surface without being reflected by other surfaces. The light reaching the inclined surface is reflected by the inclined surface toward the emission surface. The light reflected by the inclined surface is emitted forward from the emission surface.

CITATION LIST

Patent Literature

PTL 1
Japanese Patent Application Laid-Open No. 2012-160666

SUMMARY OF INVENTION

Technical Problem

However, since the quantity of the rearward light is small in the light flux controlling member disclosed in PTL 1, the balance of the light distribution characteristics of the light flux controlling member disclosed in PTL 1 is disadvantageously poor. To increase the quantity of the rearward light in the light flux controlling member disclosed in PTL 1, it is necessary to control the light such that a large part of the light incident on the incidence surface reaches the emission surface without being reflected by other surfaces. To control the light in the light flux controlling member disclosed in PTL 1 such that a large part of the light incident on the incidence surface reaches the emission surface light without being reflected by other surfaces, it is conceivable to enlarge the emission surface (diameter). In this manner, a large part of the light incident on the incidence surface can be controlled to reach the enlarged emission surface without being reflected by other surfaces so that the quantity of rearward light is increased.

When the emission surface (diameter) is enlarged, however, the size of the light flux controlling member is disadvantageously increased. In view of this, conventional light flux controlling members cannot achieve both downsizing and optimizing the balance of distribution characteristics at the same time.

In view of this, an object of the present invention is to provide a light flux controlling member which can be downsized, and can achieve light distribution with a good balance in the forward direction, the lateral direction and the rearward direction in a manner similar to electric light bulbs or fluorescent lamps. In addition, another object of the present invention is to provide a light-emitting device and an illumination apparatus having the light flux controlling member.

Solution to Problem

A light flux controlling member according to embodiments of the present invention is configured to control a distribution of light emitted from a light-emitting element, the light flux controlling member being symmetrical about the optical axis in a cross section including an optical axis of the light-emitting element, the light flux controlling member including: an incidence region configured to be disposed to face the light-emitting element; a first reflecting surface disposed on a side opposite to the incidence region; a second reflecting surface disposed at a position distanced from the optical axis in comparison with the first reflecting surface in a direction perpendicular to the optical axis; a third reflecting surface disposed on a side opposite to the second reflecting surface in a direction along the optical axis; and a connection surface connecting the first reflecting surface and the third reflecting surface. In a cross section including the optical axis and a straight line extending along the direction perpendicular to the optical axis, a part of light emitted from the light-emitting element enters the light flux controlling member from the incidence region so as to be reflected by the first reflecting surface on a same side as the incidence region with respect to the optical axis and to be emitted from the second reflecting surface on the same side as the incidence region with respect to the optical axis, and in the cross-section, another part of the light emitted from the light-emitting element enters the light flux controlling member from the incidence region so as to be reflected by the second reflecting surface and the third reflecting surface in this order on a same side as the incidence region with respect to the optical axis, before being emitted from the connection surface on the same side as the incidence region with respect to the optical axis, and so as to thereafter re-enter the light flux controlling member from the first reflecting surface on a side opposite to the incidence region with respect to the optical axis before being emitted from the second reflecting surface on the side opposite to the incidence region with respect to the optical axis.

In addition, a light-emitting device according to embodiments of the present invention includes: a light-emitting element; and the above-mentioned light flux controlling member, in which the light flux controlling member is disposed such that the incidence region faces the light-emitting element.

In addition, an illumination apparatus according to embodiments of the present invention includes: the light-emitting device according to the embodiments of the present invention; and a cover configured to allow light emitted from the light-emitting device to pass the cover while diffusing the light.

Advantageous Effects of Invention

With the light flux controlling member of embodiments of the present invention it is possible to make light distribution characteristics of an illumination apparatus including the light-emitting device close to the light distribution characteristics of incandescent lamps or fluorescent lamps, while achieving downsizing.

DESCRIPTION OF EMBODIMENTS

In the following, embodiments of the present invention are described in detail with reference to the accompanying drawings.

Embodiment 1

In Embodiment 1, an illumination apparatus which can be used in place of incandescent lamps is described as a typical example of the illumination apparatus of the embodiment of the present invention.

(Configuration of Illumination Apparatus)

Figure 1:
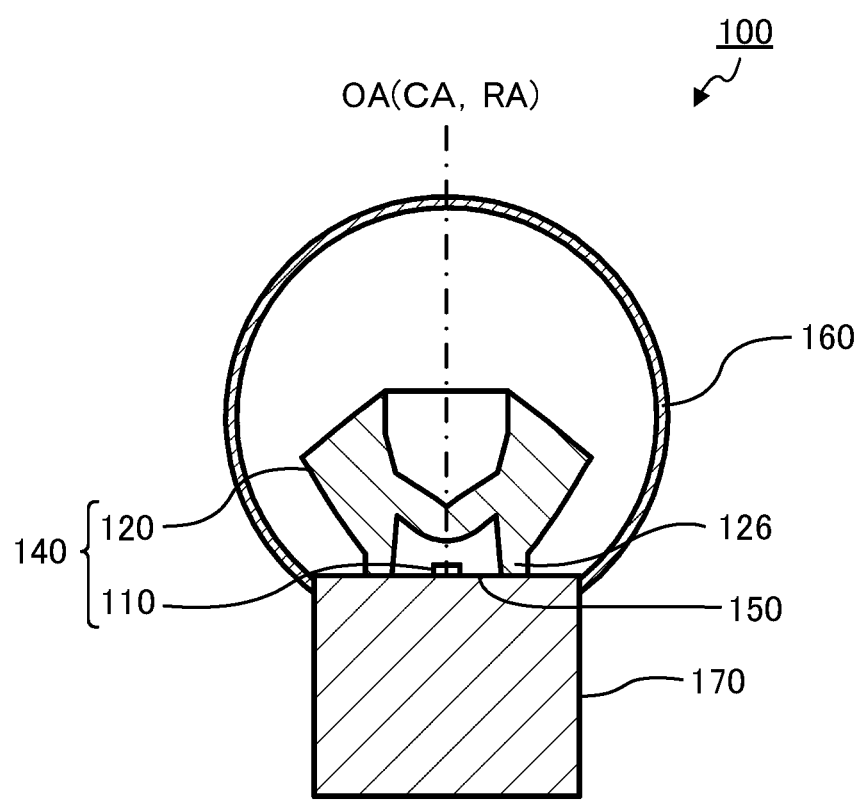
FIG. 1 is a sectional view of an illumination apparatus according to Embodiment 1.

FIG. 1 illustrates a configuration of illumination apparatus 100 according to Embodiment 1 of the present invention.

As illustrated in FIG. 1, illumination apparatus 100 includes light-emitting device 140 including light-emitting element 110 and light flux controlling member 120, substrate 150, cover 160, and casing 170.

Light-emitting element 110 is a light source of illumination apparatus 100, and is mounted in housing 170. For example, light-emitting element 110 is a light-emitting diode (LED) such as a white light-emitting diode. The number of light-emitting element 110 is not limited to one, and a plurality of light-emitting elements 100 may be provided. In the present embodiment, the number of light-emitting elements 110 is one. Light-emitting element 110 is disposed such that its optical axis OA intersects light flux controlling member 120. Here, the "optical axis of light-emitting element" means the light travelling direction at the center of a stereoscopic light flux from light-emitting element 110. In the case where a plurality of light-emitting elements 110 are provided, the "optical axis of light-emitting element" means the light travelling direction at the center of a stereoscopic light flux from light-emitting elements 100. In the following description, the emission direction of light emitted from light-emitting element 110 along optical axis OA is the forward direction, and the direction opposite to the forward direction is the rearward direction.

Light flux controlling member 120 controls the distribution of the light emitted from light-emitting element 110. Light flux controlling member 120 is disposed on housing 170 so as to intersect optical axis OA of light-emitting element 110. In the present embodiment, the shape of light flux controlling member 120 is rotationally symmetrical about rotation axis RA. That is, in the present embodiment, rotation axis RA of light flux controlling member 120 and central axis CA coincide with each other. In addition, in the present embodiment, light flux controlling member 120 is disposed such that rotation axis RA (central axis CA) and optical axis OA of light-emitting element 110 coincides with each other. The material of light flux controlling member 120 is not limited as long as the light having desired wavelengths can pass through light flux controlling member 120. Examples of the material of light flux controlling member 120 include: translucent resins such as polymethylmethacrylate (PMMA), polycarbonate (PC), and epoxy resin (EP); or translucent glass. In addition, light flux controlling member 120 is produced by injection molding for example. For example, light flux controlling member 120 has a diameter of 11.5 mm, and a height of 7 mm one of the features of the present invention is the shape of light flux controlling member 120, and therefore the details of light flux controlling member 120 are described later.

Substrate 150 supports light-emitting element 110 and light flux controlling member 120. Substrate 150 is disposed on casing 170. Substrate 150 is made of, for example, a metal having a high thermal conductivity such as aluminum and copper. When substrate 150 does not require high thermal conductivity, substrate 150 may be composed of a resin substrate having glass nonwoven fabric impregnated with epoxy resin.

Cover 160 covers light flux controlling member 120, and allows light emitted from light flux controlling member 120 to pass cover 160 while diffusing the light. Cover 160 is optically transparent. Cover 160 includes a hollow region including an opening. Light-emitting device 140 is disposed in the hollow region of cover 160. Examples of the material of cover 160 include translucent resins such as polymethylmethacrylate (PMMA), polycarbonate (PC), and epoxy resin (EP); and glass. Cover 160 has a light diffusing property. The way of giving the light diffusion function to cover 160 is not limited. For example, a light diffusion process (for example, roughening process) may be performed on the inner surface or the outer surface of cover 160 produced with a transparent material, or a light diffusing material containing a scattering member such as beads may be added to the above-mentioned transparent material to produce cover 160.

Preferably, cover 160 includes a shape which is rotationally symmetrical about rotation axis RA of light flux controlling member 120. Cover 160 may have a shape which is composed only of a shape rotationally symmetrical shape, or a shape which includes a part of a rotationally symmetrical shape, for example. Preferably, cover 160 has a shape which can further improve the balance of the light distribution of light emitted from light flux controlling member 120. For example, preferably, cover 160 has a shape in which the diameter of the opening of cover 160 is smaller than the maximum outer diameter of cover 160 from the viewpoint of increasing the quantity of the light toward the rearward direction. For example, the shape of cover 160 may be a spherical cap shape (a shape obtained by cutting out a part of a sphere along a plane).

Casing 170 supports, at a front end portion of casing 170, substrate 150 on which light-emitting element 110 and light flux controlling member 120 are disposed, and cover 160. Casing 170 is substantially rotationally symmetrical about rotation axis RA of light flux controlling member 120. Housing 170 serves also as a heat sink for emitting the heat of light-emitting element 110. In view of this, housing 170 is preferably composed of a metal having high thermal conductivity such as aluminum and copper.

The light emitted from light-emitting element 110 is controlled by light flux controlling member 120 such that the light travels toward all directions. The light emitted from light flux controlling member 120 passes through cover 160 while being diffused.

(Configuration of Light Flux Controlling Member)

Figure 2A:
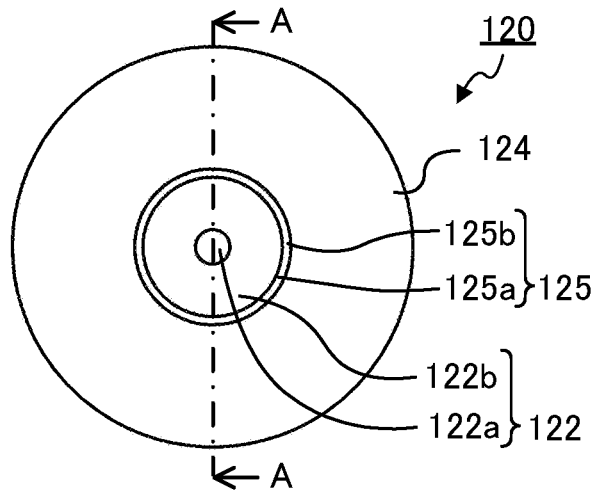
FIG. 2A to FIG. 2D illustrate a configuration of the light flux controlling member according to Embodiment 1.
Figure 2C:
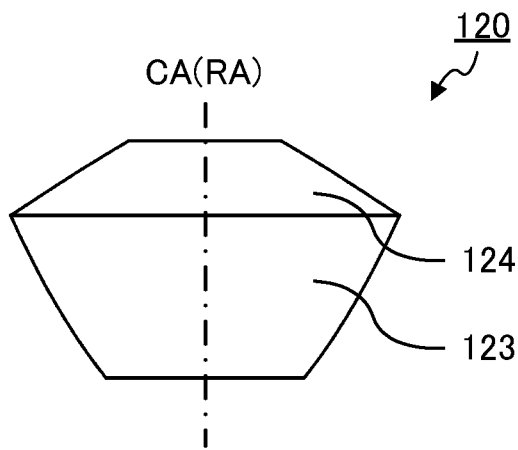
Figure 2B:
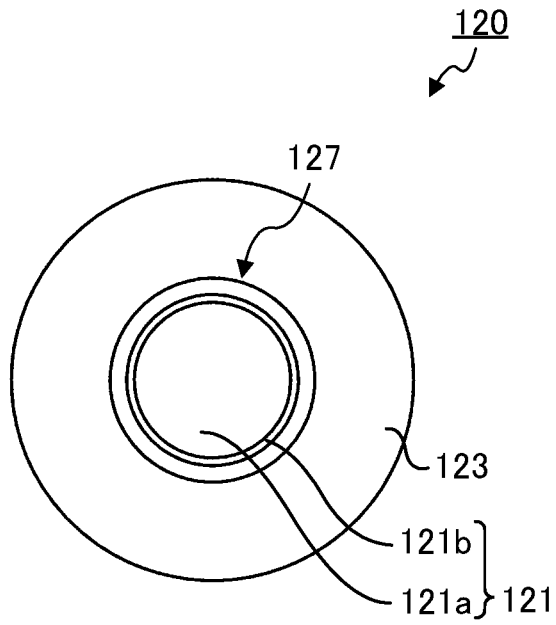
Figure 2D:
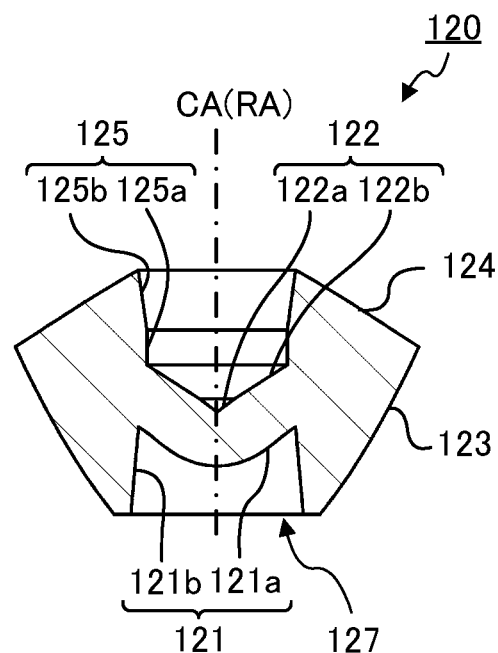

Now light flux controlling member 120 is described in detail. FIG. 2A to FIG. 2D illustrate a configuration of light flux controlling member 120. FIG. 2A is a plan view of light flux controlling member 120 according to Embodiment 1, FIG. 2B is a bottom view of light flux controlling member 120, FIG. 2C is a side view of light flux controlling member 120, and FIG. 2D is a sectional view of light flux controlling member 120 taken along line A-A of FIG. 2A.

As illustrated in FIG. 2A to FIG. 2D, light flux controlling member 120 includes incidence region 121, first reflecting surface 122, second reflecting surface 123, third reflecting surface 124, and connection surface 125. In addition, in the present embodiment, light flux controlling member 120 includes leg part 126 for defining a gap to dissipate heat generated by light-emitting element 110, and for fixing light flux controlling member 120 to substrate 150 (see FIG. 1). It is to be noted that leg part 126 is omitted in FIG. 2A to FIG. 2D.

As described above, light flux controlling member 120 is rotationally symmetrical about rotation axis RA (central axis CA) except in leg part 126. That is, incidence region 121, first reflecting surface 122, second reflecting surface 123, third reflecting surface 124, and connection surface 125 are rotationally symmetrical surfaces.

Incidence region 121 is disposed to face light-emitting element 110. Incidence region 121 allows light emitted from light-emitting element 110 to enter light flux controlling member 120. The shape of incidence region 121 is not limited as long as the above-described function can be ensured. Incidence region 121 may be composed of a plane surface, or a curved surface, or, a plurality of surfaces. In the present embodiment, incidence region 121 is composed of a plurality of surfaces, and includes first incidence surface 121a and second incidence surface 121b.

First incidence surface 121a is a convex lens surface disposed to face light-emitting element 110. First incidence surface 121a allows light emitted from light-emitting element 110 with a small emission angle with respect to optical axis OA to enter light flux controlling member 120. In addition, first incidence surface 121a refracts (condenses) light emitted from light-emitting element 110 such that the light reaches first reflecting surface 122 without reaching third reflecting surface 124. The shape of first incidence surface 121a is not limited as long as the above-described function can be ensured. First incidence surface 121a may be composed of a plane surface or a curved surface, or may include a plurality of surfaces. In the present embodiment, first incidence surface 121a is a curved surface. In addition, in the present embodiment, first incidence surface 121a is formed in a shape in which, as the distance thereof from optical axis OA increases, the distance thereof from the plane including the light-emitting surface of light-emitting element 110 increases. In addition, in the cross section including rotation axis RA (central axis CA), first incidence surface 121a is formed such that as the distance thereof from optical axis OA increases, the inclination of the tangent thereto gradually increases.

In the direction perpendicular to optical axis OA, second incidence surface 121b is disposed on second reflecting surface 123 side (outside in the radial direction) relative to first incidence surface 121a. Second incidence surface 121b allows light emitted from light-emitting element 110 with a large emission angle with respect to optical axis OA to enter light flux controlling member 120. In addition, second incidence surface 121b controls light emitted from light-emitting element 110 with a large emission angle with respect to optical axis OA such that the light reaches second reflecting surface 123. The shape of second incidence surface 121b is not limited as long as the above-described function can be ensured. Second incidence surface 121b may be composed of one surface, or a plurality of surfaces. In the present embodiment, second incidence surface 121b is composed of one surface. In addition, in the present embodiment, second incidence surface 121b is formed such that as the distance thereof from optical axis OA increases, the distance thereof to the plane including the light-emitting surface of light-emitting element 110 decreases. In the cross section including rotation axis RA, the shape of second incidence surface 121b may be a straight line, or a curve. In the present embodiment, the shape of second incidence surface 121b in the cross section including rotation axis RA is a straight line. In addition, the inclination angle of second incidence surface 121b with respect to rotation axis RA in the cross section including rotation axis RA is not limited. In the present embodiment, the inclination angle of second incidence surface 121b with respect to rotation axis RA in the cross section including rotation axis RA is slightly tilted in consideration of the releasing in injection molding.

With the above-mentioned configuration, first incidence surface 121a and second incidence surface 121b serve also as the internal surface of first recess 127 that opens on the rear side (the rear surface) of light flux controlling member 120. In the present embodiment, first recess 127 has a substantially columnar shape whose top surface is raised toward the inside. In this case, the inner top surface of first recess 127 corresponds to first incidence surface 121a, and the internal side surface of first recess 127 corresponds to second incidence surface 121b.

First reflecting surface 122 is disposed on the side opposite to incidence region 121. First reflecting surface 122 reflects a part of light incident on incidence region 121 toward second reflecting surface 123 on the same side as first reflecting surface 122 with respect to optical axis OA in the cross section including optical axis OA. First reflecting surface 122 may be composed of one surface, or a plurality of surfaces. In the present embodiment, first reflecting surface 122 is composed of a plurality of surfaces. First reflecting surface 122 includes first inner reflecting surface 122a and first outer reflecting surface 122b. The shapes of first inner reflecting surface 122a and first outer reflecting surface 122b are not limited as long as the above-described function can be ensured. The shape of each of first inner reflecting surface 122a and first outer reflecting surface 122b in the cross section including rotation axis RA may be a straight line, or a curve. In the present embodiment, the shape of each of first inner reflecting surface 122a and first outer reflecting surface 122b is a curve. In addition, in the present embodiment, in the cross section including rotation axis RA, first inner reflecting surface 122a and first outer reflecting surface 122b are formed such that as the distance thereof from rotation axis RA increases, the inclination of the tangent thereto gradually decreases.

In the direction perpendicular to optical axis OA of light-emitting element 110, second reflecting surface 123 is distanced (on the outside in the radial direction) from optical axis OA in comparison with incidence region 121. Mainly, second reflecting surface 123 reflects, toward third reflecting surface 124, light which is emitted from light-emitting element 110 and is incident on second incidence surface 121b, or, second reflecting surface 123 emits, to the outside, light reflected by first reflecting surface 122. That is, second reflecting surface 123 functions as a reflecting surface or an emission surface in accordance with arrival light. Second reflecting surface 123 may be composed of one surface, or a plurality of surfaces. In the present embodiment, second reflecting surface 123 is composed of one surface. The shape of second reflecting surface 123 is not limited as long as the above-described function can be ensured. The shape of second reflecting surface 123 in the cross section including rotation axis RA may be a straight line, or a curve. In the present embodiment, second reflecting surface 123 is composed of a curve. In addition, in the present embodiment, in the cross section including rotation axis RA, second reflecting surface 123 is formed such that as the distance thereof to third reflecting surface 124 decreases, the distance thereof from optical axis OA increases. In addition, in the cross section including rotation axis RA (central axis CA), second reflecting surface 123 is formed such that as the distance thereof to third reflecting surface 124 decreases, the inclination of the tangent thereto gradually increases.

In the direction along optical axis OA of each light-emitting element 110, third reflecting surface 124 is disposed on the side (upper side) opposite to second reflecting surface 123. To be more specific, third reflecting surface 124 is disposed at a position distanced from the plane including the light-emitting surface of light-emitting element 110 in comparison with second reflecting surface 123. Mainly, third reflecting surface 124 reflects, toward connection surface 125, light reflected by second reflecting surface 123. Third reflecting surface 124 may be composed of one surface, or a plurality of surfaces. In the present embodiment, third reflecting surface 124 is composed of one surface. The shape of third reflecting surface 124 is not limited as long as the above-described function can be ensured. The shape of third incidence surface 124 in the cross section including rotation axis RA may be a straight line, or a curve. In the present embodiment, the shape of third reflecting surface 124 in the cross section including rotation axis RA is a curve. In addition, in the present embodiment, in the cross section including rotation axis RA, third reflecting surface 124 is formed such that as the distance thereof to second reflecting surface 123 decreases, the distance thereof from optical axis OA increases. In addition, in the cross section including rotation axis RA (central axis CA), third reflecting surface 124 is formed such that as the distance thereof to second reflecting surface 123 decreases, the inclination of the tangent thereto gradually decreases.

In addition, in the present embodiment, in the direction along optical axis OA, one end of third reflecting surface 124 is connected with one end of second reflecting surface 123. The position of the boundary between second reflecting surface 123 and third reflecting surface 124 in the direction along optical axis OA is not limited as long as light incident on second incidence surface 121b can reach second reflecting surface 123. In the present embodiment, the boundary is formed at a position such that light which is emitted from light-emitting element 110 and reflected by second reflecting surface 123 reaches third reflecting surface 124.

Connection surface 125 connects first reflecting surface 122 and third reflecting surface 124. Connection surface 125 emits, to the outside, light reflected by third reflecting surface 124. Connection surface 125 may be composed of one surface, or a plurality of surfaces. In the present embodiment, connection surface 125 is composed of a plurality of surfaces. In the present embodiment, connection surface 125 includes first connection surface 125a and second connection surface 125b.

In the direction along optical axis OA, first connection surface 125a is disposed on first reflecting surface 122 side (lower side), and second connection surface 125b is disposed at a position distanced from the plane including the light-emitting surface of light-emitting element 110 in comparison with first connection surface 125a. In addition, the shapes of first connection surface 125a and second connection surface 125b (connection surface 125) in the cross section including rotation axis RA are not limited as long as light emitted from connection surface 125 can be incident on first reflecting surface 122 on the opposite side. Each of the shapes of first connection surface 125a and second connection surface 125b in the cross section including rotation axis RA may be a straight line, or a curve. In the present embodiment, each of the shapes of first connection surface 125a and second connection surface 125b in the cross section including rotation axis RA is a straight line. The inclination angles of first connection surface and second connection surface 125b with respect to rotation axis RA in the cross section including rotation axis RA are not limited. The inclination angle of first connection surface 125a with respect to rotation axis RA is 0°. That is, in the present embodiment, first connection surface 125a is disposed in the direction along rotation axis RA. In addition, in the present embodiment, second connection surface 125b is formed such that as the distance thereof from optical axis OA increases, the distance thereof from first connection surface 125a increases. That is, in the present embodiment, second connection surface 125b is slightly tilted with respect to rotation axis RA in consideration of the releasing in injection molding.

(Light Path in Light Flux Controlling Member)

Light paths of light emitted from light-emitting element 110 in light flux controlling member 120 according to the present embodiment were simulated. Also, for comparison, light paths were simulated with light flux controlling member 220 according to Comparative example 1 illustrated in FIG. 3, and with light flux controlling member 320 according to Comparative example 2 illustrated in FIG. 4.

Figure 3A:
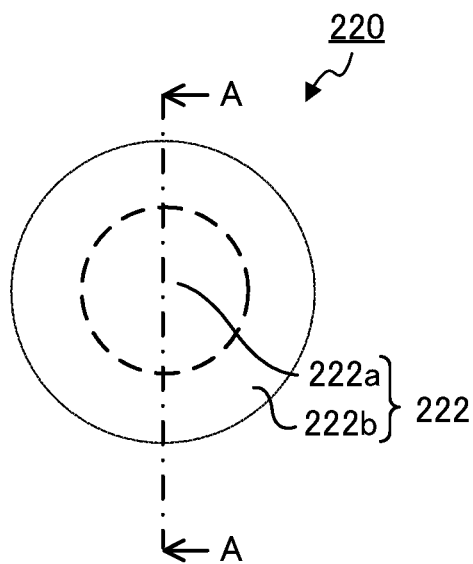
FIG. 3A to FIG. 3D illustrate a configuration of a light flux controlling member according to Comparative example 1.
Figure 3C:
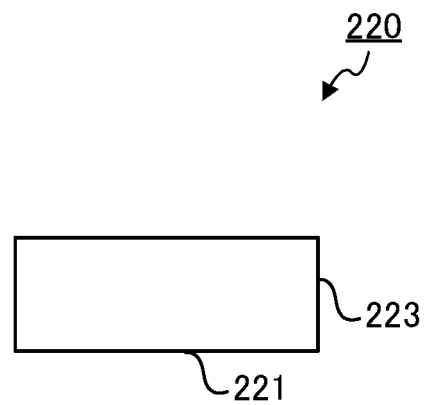
Figure 3B:
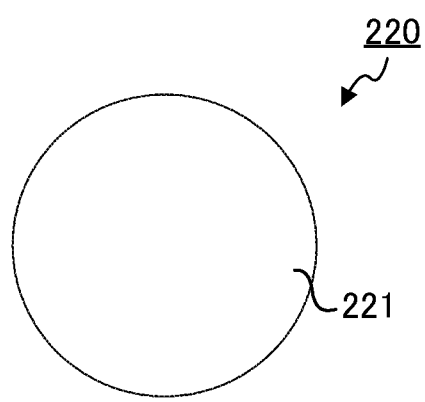
Figure 3D:
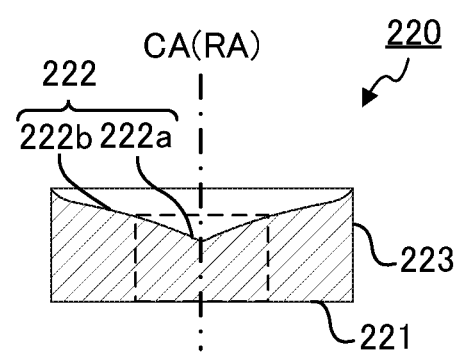

FIG. 3 to FIG. 3D illustrate a configuration of light flux controlling member 220 according to Comparative example 1. FIG. 3A is a plan view of light flux controlling member 220 according to Comparative example 1, FIG. 3B is a bottom view of light flux controlling member 220, FIG. 3C is a side view of light flux controlling member 220, and FIG. 3D is a sectional view of light flux controlling member 220 taken along line A-A of FIG. 3A.

As illustrated in FIG. 3A to FIG. 3D, light flux controlling member 220 according to Comparative example 1 is rotationally symmetrical about central axis CA, and includes incidence surface 221 disposed to face light-emitting element 110, reflecting surface 222 disposed on the side opposite to incidence surface 221, and emission surface 223 that connects the external edge of incidence surface 221 and the external edge of reflecting surface 222. For example, light flux controlling member 220 according to Comparative example 1 has a diameter of 35 mm, and a height of 13 mm. With this configuration, light flux controlling member 220 according to Comparative example 1 is larger than light flux controlling member 120 according to Embodiment 1.

Incidence surface 221 is formed in a planar shape. In addition, reflecting surface 222 includes first reflecting surface 222a formed to intersect central axis CA, and second reflecting surface 222b disposed to surround first reflecting surface 222a. First reflecting surface 222a emits a part of light incident on incidence surface 221 in a direction away from light central axis CA. Second reflecting surface 222b internally reflects, toward light emission surface 223, another part of the light incident on incidence surface 221. Emission surface 223 emits, to the outside, light reflected by reflecting surface 222.

Figure 4A:
FIG. 4A to FIG. 4D illustrate a configuration of a light flux controlling member according to Comparative example 2.
Figure 4C:
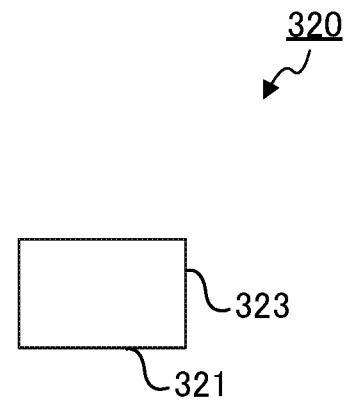
Figure 4B:
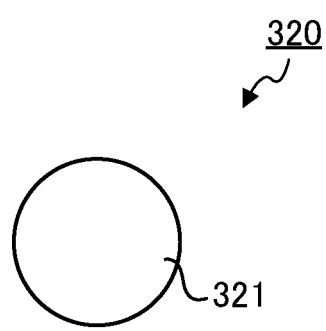
Figure 4D:
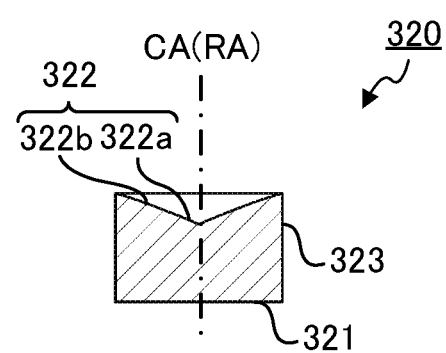

FIG. 4A to FIG. 4D illustrate a configuration of light flux controlling member 320 according to Comparative example 2. FIG. 4A is a plan view of light flux controlling member 320 according to Comparative example 2, FIG. 4B is a bottom view of light flux controlling member 320, FIG. 4C is a side view of light flux controlling member 320, and FIG. 4D is a sectional view of light flux controlling member 320 taken along line A-A of FIG. 4A.

As illustrated in FIG. 4A to FIG. 4D, light flux controlling member 320 according to Comparative example 2 is rotationally symmetrical about central axis CA, and includes incidence surface 321 disposed to face light-emitting element 110, reflecting surface 322 (first reflecting surface 322a and second reflecting surface 322b) disposed on the side opposite to incidence surface 321, and emission surface 323 that connects the external edge of incidence surface 321 and the external edge of reflecting surface 322. For example, light flux controlling member 320 according to Comparative example 2 has a diameter of 15 mm, and a height of 9.8 mm With this configuration, light flux controlling member 320 according to Comparative example 2 is larger than light flux controlling member 120 according to Embodiment 1. In addition, light flux controlling member 320 according to Comparative example 2 has a shape which is identical to that of a part of light flux controlling member 220 according to Comparative example 1 in the proximity of central axis CA. That is, light flux controlling member 320 according to Comparative example 2 has a shape corresponding to the region indicated by the broken line in FIG. 3A and FIG. 3D.

Figure 5A:
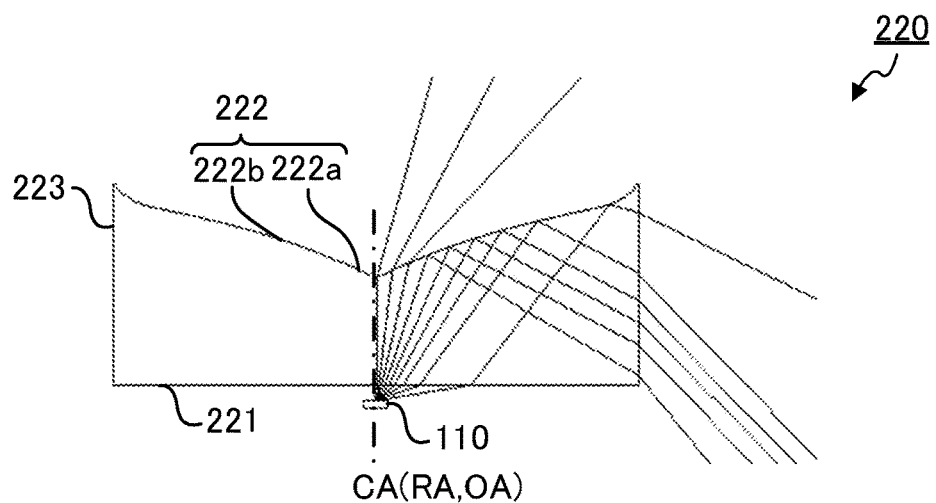
FIG. 5A to FIG. 5C illustrate light paths in the light flux controlling member according to Comparative example 1.
Figure 5B:
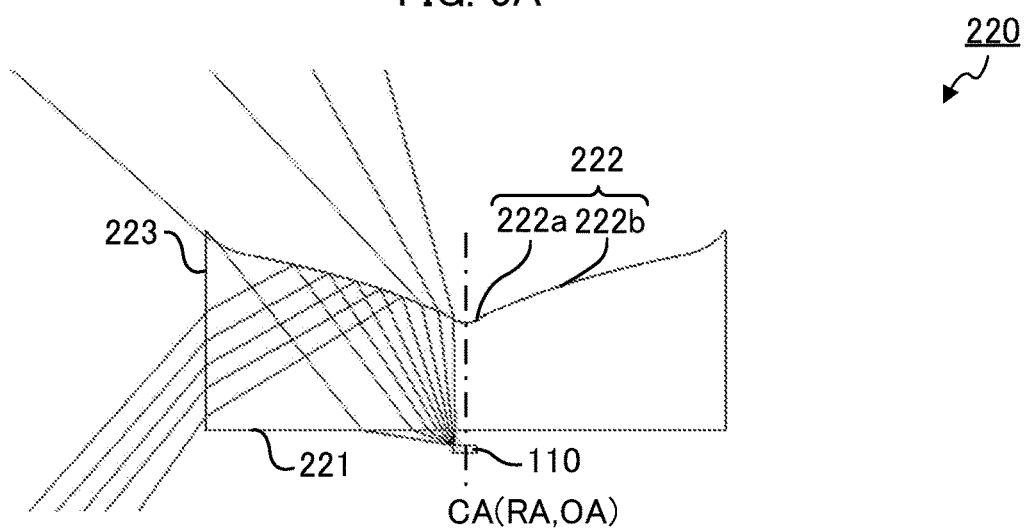
Figure 5C:
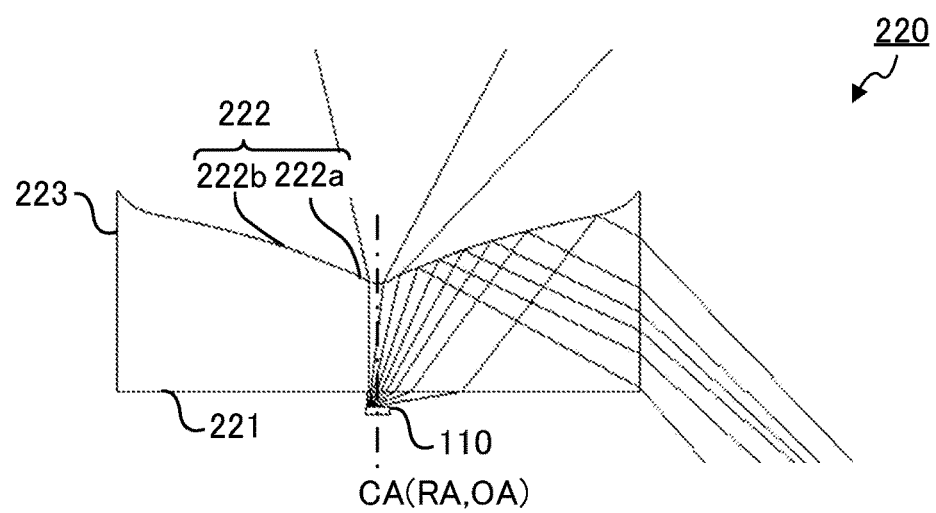

FIG. 5A to FIG. 5C illustrate light paths in light flux controlling member 220 according to Comparative example 1. FIG. 5A to FIG. 5C illustrate light paths in the cross section including rotation axis RA. FIG. 5A illustrates light paths of light emitted from the center of light-emitting element 110 to one side with respect to optical axis OA, and FIG. 5B illustrates light paths of light emitted outward from one end of light-emitting element 110. FIG. 5C illustrates light paths of light emitted from one end of light-emitting element 110 toward optical axis OA side. It is to be noted that, in FIG. 5A to FIG. 5C, hatching is omitted to illustrate light paths.

As illustrated in FIG. 5A, light emitted from the center of light-emitting element 110 enters light flux controlling member 220 from incidence surface 221. Light incident on incidence surface 221 with a small emission angle with respect to optical axis OA of light-emitting element 110 is emitted from light first reflecting surface 222a in a direction away from optical axis OA. In addition, light incident on incidence surface 221 with a large emission angle with respect to optical axis OA of light-emitting element 110 is reflected by second reflecting surface 222b and emitted from emission surface 223. In addition, as illustrated in FIG. 5B and FIG. 5C, in the cross section including rotation axis RA, light emitted from one end of light-emitting element 110 enters light flux controlling member 220 from incidence surface 221. The light incident on incidence surface 221 with a small emission angle with respect to optical axis OA of light-emitting element 110 is emitted from light first reflecting surface 222a in a direction away from optical axis OA. In addition, the light incident on incidence surface 221 with a large emission angle with respect to optical axis OA of light-emitting element 110 is reflected by second reflecting surface 222b and emitted from emission surface 223. At this time, a large part of the light emitted from emission surface 223 is emitted rearward. In this manner, light flux controlling member 220 according to Comparative example 1 can achieve a relatively favorable light distribution balance.

Figure 6A:
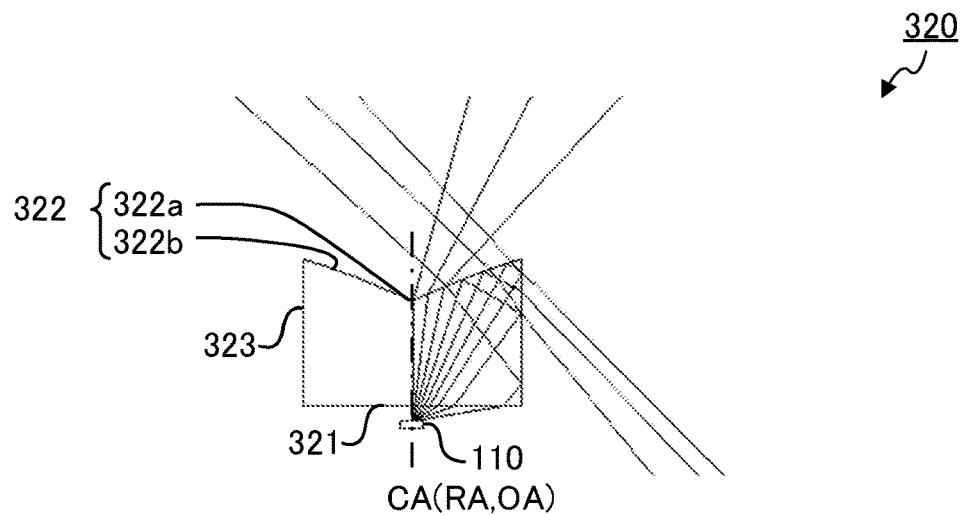
FIG. 6A to FIG. 6C illustrate light paths in the light flux controlling member according to Comparative example 2.
Figure 6B:
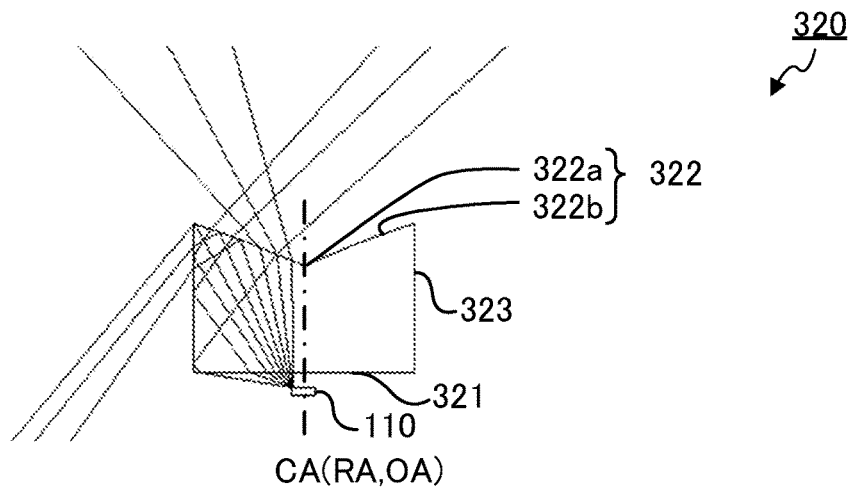
Figure 6C:
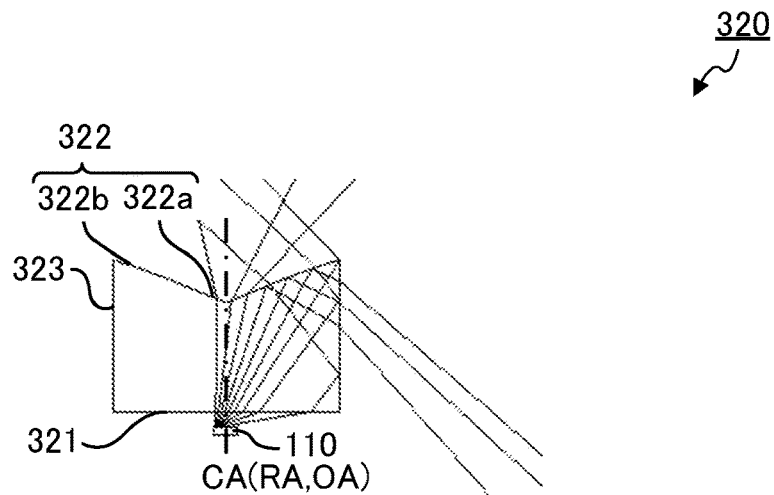

FIG. 6A to FIG. 6C illustrate light paths in light flux controlling member 320 according to Comparative example 2. FIG. 6A to FIG. 6C illustrate light paths in the cross section including rotation axis RA. FIG. 6A illustrates light paths of light emitted from the center of light-emitting element 110 to one side with respect to optical axis OA, and FIG. 6B illustrates light paths of light emitted outward from one end of light-emitting element 110. FIG. 6C illustrates light paths of light emitted from one end of light-emitting element 110 toward optical axis OA side. It is to be noted that, in FIG. 6A to FIG. 6C, hatching is omitted to illustrate light paths.

As illustrated in FIG. 6A, light emitted from the center of light-emitting element 110 enters light flux controlling member 320 from incidence surface 321. Light which is incident on incidence surface 321 with a small emission angle with respect to optical axis OA of light-emitting element 110 is emitted from first reflecting surface 322a in a direction away from optical axis OA. In addition, light which is incident on incidence surface 321 with a large emission angle with respect to optical axis OA of light-emitting element 110 is reflected from first reflecting surface 322a and emitted from emission surface 323. In addition, as illustrated in FIG. 6B and FIG. 6C, in the cross section including rotation axis RA, light emitted from one end of light-emitting element 110 enters light flux controlling member 320 from incidence surface 321. The light which is incident on incidence surface 321 with a small emission angle with respect to optical axis OA of light-emitting element 110 is emitted from first reflecting surface 322a in a direction away from optical axis OA. In addition, the light which is incident on incidence surface 321 with a large emission angle with respect to optical axis OA of light-emitting element 110 is reflected from first reflecting surface 322a and emitted from emission surface 323. In this manner, since light flux controlling member 320 according to Comparative example 2 has a shape which is obtained by reducing the diameter of light flux controlling member 220 according to Comparative example 1, the light distribution balance of light flux controlling member 320 according to Comparative example 2 is poorer than light flux controlling member 220 of Comparative example 1.

Figure 7A:
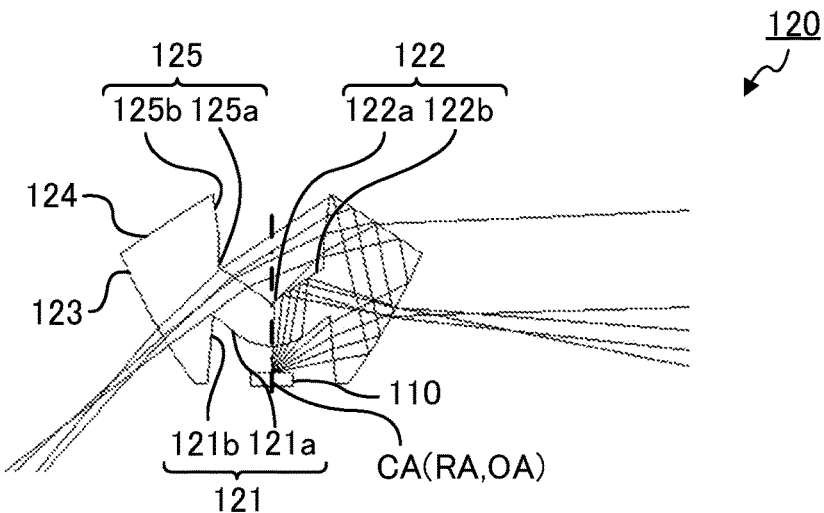
FIG. 7A to FIG. 7C illustrate light paths in the light flux controlling member according to Embodiment 1.
Figure 7B:
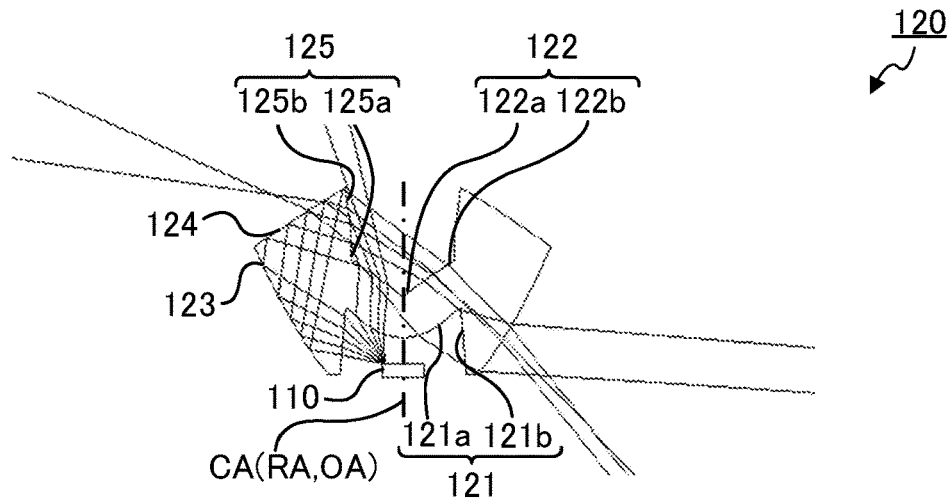
Figure 7C:
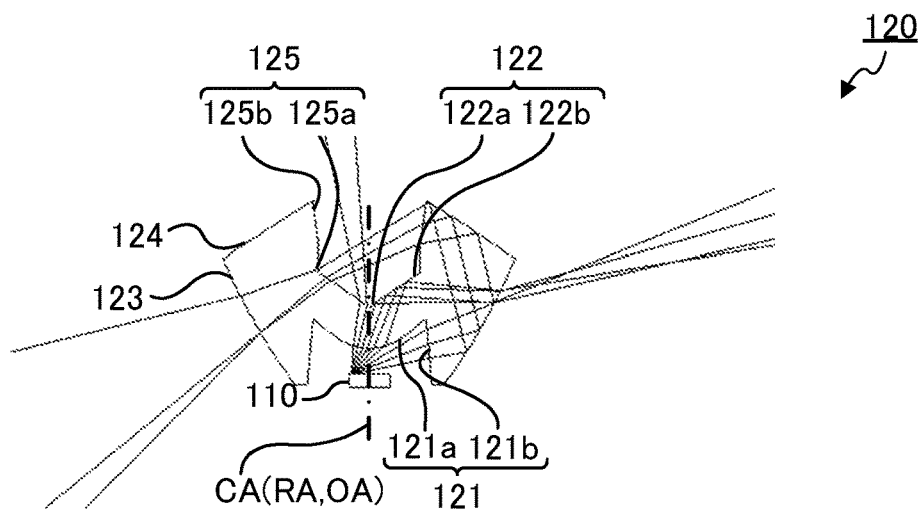

FIG. 7A to FIG. 7C illustrate light paths in light flux controlling member 120 according to the present embodiment. FIG. 7A to FIG. 7C illustrate light paths in the cross section including rotation axis RA. FIG. 7A illustrates light paths of light emitted from the center of light-emitting element 110, and FIG. 7B illustrates light paths of light emitted outward from one end of light-emitting element 110. FIG. 7C illustrates light paths of light emitted from one end of light-emitting element 110 toward optical axis OA side in the cross section including rotation axis RA. It is to be noted that, in FIG. 7A to FIG. 7C, hatching is omitted to illustrate light paths.

As illustrated in FIG. 7A, light emitted from the center of light-emitting element 110 enters light flux controlling member 120 from incidence region 121. To be more specific, light emitted from the center of light-emitting element 110 with a small emission angle with respect to optical axis OA of light-emitting element 110 enters light flux controlling member 120 from light first incidence surface 121a. The light having entered light flux controlling member 120 from first incidence surface 121a is reflected by first reflecting surface 122 on the same side as the first incidence surface 121a with respect to optical axis OA, and emitted from the second reflecting surface 123 on the same side. At this time, a large part of the light emitted from second reflecting surface 123 is emitted laterally or rearward. On the other hand, the light emitted from the center of light-emitting element 110 with a large emission angle with respect to optical axis OA of light-emitting element 110 enters light flux controlling member 120 from second incidence surface 121b. In the cross section including rotation axis RA, the light having entered light flux controlling member 120 from second incidence surface 121b is reflected by second reflecting surface 123 and then by third reflecting surface 124 on the same side as that second incidence surface 121b with respect to optical axis OA, and thereafter emitted from connection surface 125 on the same side. In the cross section including rotation axis RA, light emitted from connection surface 125 re-enters light flux controlling member 120 from first reflecting surface 122a or connection surface 125 on the opposite side with respect to optical axis OA, and thereafter emitted from the second reflecting surface 123 on the opposite side with respect to optical axis OA. At this time, a large part of the light emitted from second reflecting surface 123 is emitted rearward.

As illustrated in FIG. 7B, in the cross section including rotation axis RA, light emitted from one end of light-emitting element 110 to the same side, with respect to optical axis OA, as the end portion of the light-emitting surface from which light has been emitted enters light flux controlling member 120 from first incidence surface 121a and second incidence surface 121b on the same side. To be more specific, light emitted from an end portion of light-emitting element 110 with a small emission angle with respect to optical axis OA of light-emitting element 110 enters light flux controlling member 120 from light first incidence surface 121a. A large part of the light having entered light flux controlling member 120 from first incidence surface 121a is emitted, to the outside, from first reflecting surface 122 on the same side, with respect to optical axis OA, as first incidence surface 121a from which light has entered light flux controlling member 120. On the other hand, the light having entered light flux controlling member 120 from second incidence surface 121b is reflected by second reflecting surface 123 and then by third reflecting surface 124 on the same side as second incidence surface 121b with respect to optical axis OA. The light reflected by third reflecting surface 124 is once emitted, to the outside, from connection surface 125 on the same side. The light emitted from connection surface 125 re-enters light flux controlling member 120 from first reflecting surface 122 on the opposite side with respect to optical axis OA, and is then emitted from second reflecting surface 124 on the opposite side. At this time, a large part of the light emitted from second reflecting surface 123 is emitted rearward.

As illustrated in FIG. 7C, in the cross section including rotation axis RA, light emitted from one end of light-emitting element 110 to the side opposite to the end portion of the light-emitting surface with respect to optical axis OA enters light flux controlling member 120 from light first incidence surface 121a on the same side as the end portion of the light-emitting surface from which the light has been emitted, and second incidence surface 121b on the opposite side. To be more specific, the light emitted from an end portion of light-emitting element 110 with a small emission angle with respect to optical axis OA of light-emitting element 110 enters light flux controlling member 120 from light first incidence surface 121a. A large part of the light having entered light flux controlling member 120 from first incidence surface 121a is emitted, to the outside, from second reflecting surface 123 on the opposite side. On the other hand, the light having entered light flux controlling member 120 from second incidence surface 121b is reflected by second reflecting surface 123 and then by third reflecting surface 124 on the same side as second incidence surface 123 with respect to optical axis OA. The light reflected by third reflecting surface 124 is once emitted, to the outside, from connection surface 125 on the same side. The light emitted from connection surface 125 re-enters light flux controlling member 120 from first reflecting surface 122 on the opposite side with respect to optical axis OA, and thereafter emitted from second reflecting surface 123 on the opposite side. At this time, a large part of the light emitted from second reflecting surface 123 is emitted rearward.

In the above-mentioned manner, in light flux controlling member 120 according to the present embodiment, light emitted from light-emitting element 110 is emitted to the front side, lateral sides and rear side. That is, although light flux controlling member 120 according to the present embodiment is smaller than light flux controlling member 320 according to Comparative example 2, light flux controlling member 120 according to the present embodiment can achieve favorable light distribution balance.

(Light Distribution Characteristics of Light-Emitting Device and Illumination Apparatus)

Next, to confirm the effect of flux controlling member 120 according to the present embodiment, the light distribution characteristics of light-emitting device 140 having one light-emitting element 110 and light flux controlling member 120, and the light distribution characteristics of illumination apparatus 100 in which cover 160 is attached to light-emitting device 140 were simulated. In addition, for comparison, a light-emitting device and an illumination apparatus provided with light flux controlling member 220 according to Comparative example 1 illustrated in FIG. 3, and a light-emitting device and an illumination apparatus provided with light flux controlling member 320 according to Comparative example 2 illustrated in FIG. 4 were also simulated. In each simulation, with the reference point set at the intersection of rotation axis RA and the light-emitting surface of light-emitting element 110, the relative illuminances in all directions in a plane including rotation axis RA were determined. In addition, in each simulation, the illuminance in a virtual plane distanced by 1,000 mm from the reference point was computed.

Figure 8:
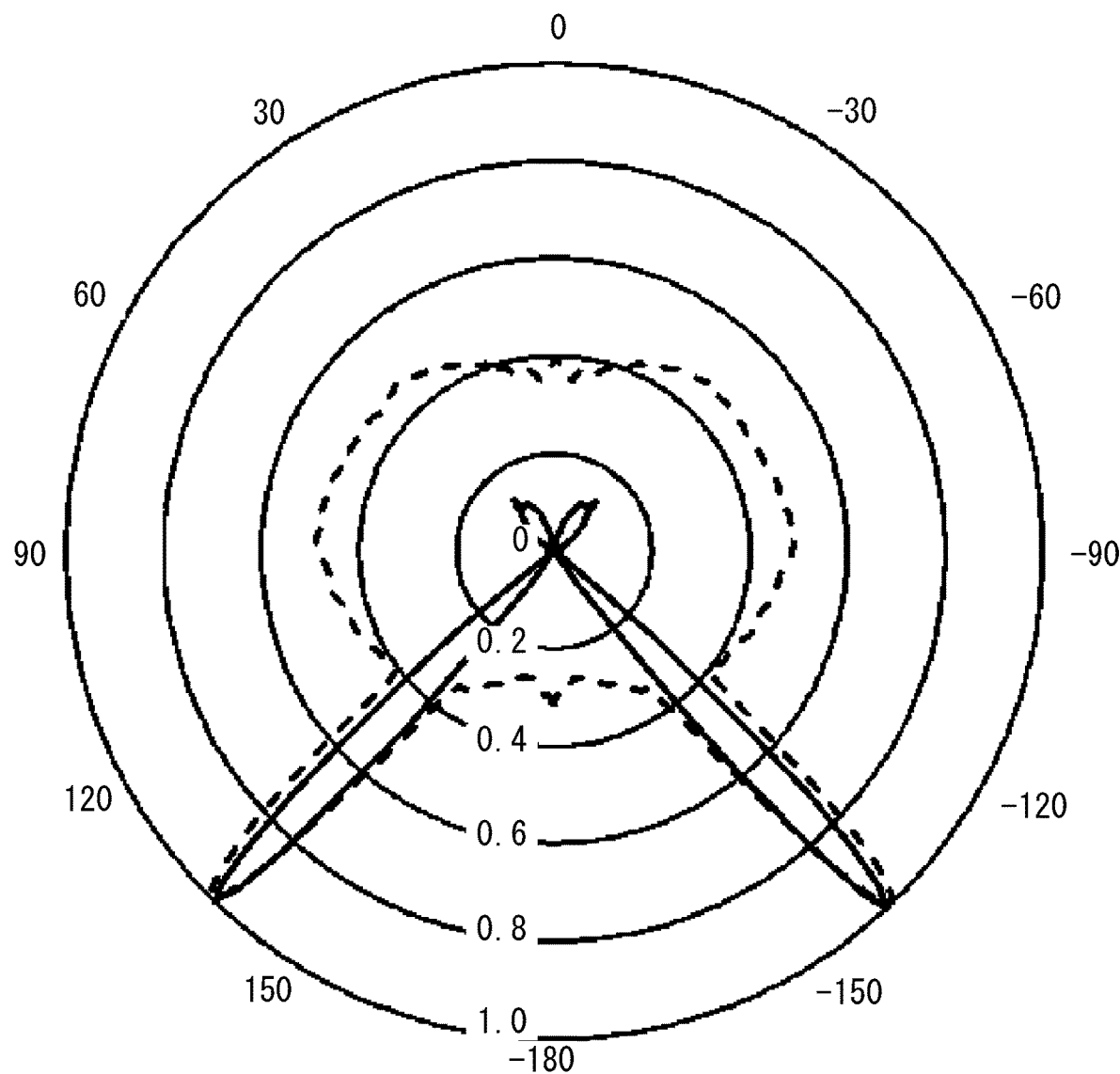
FIG. 8 is a graph illustrating light distribution characteristics of a light-emitting device and an illumination apparatus including the light flux controlling member according to Comparative example 1.
Figure 9:
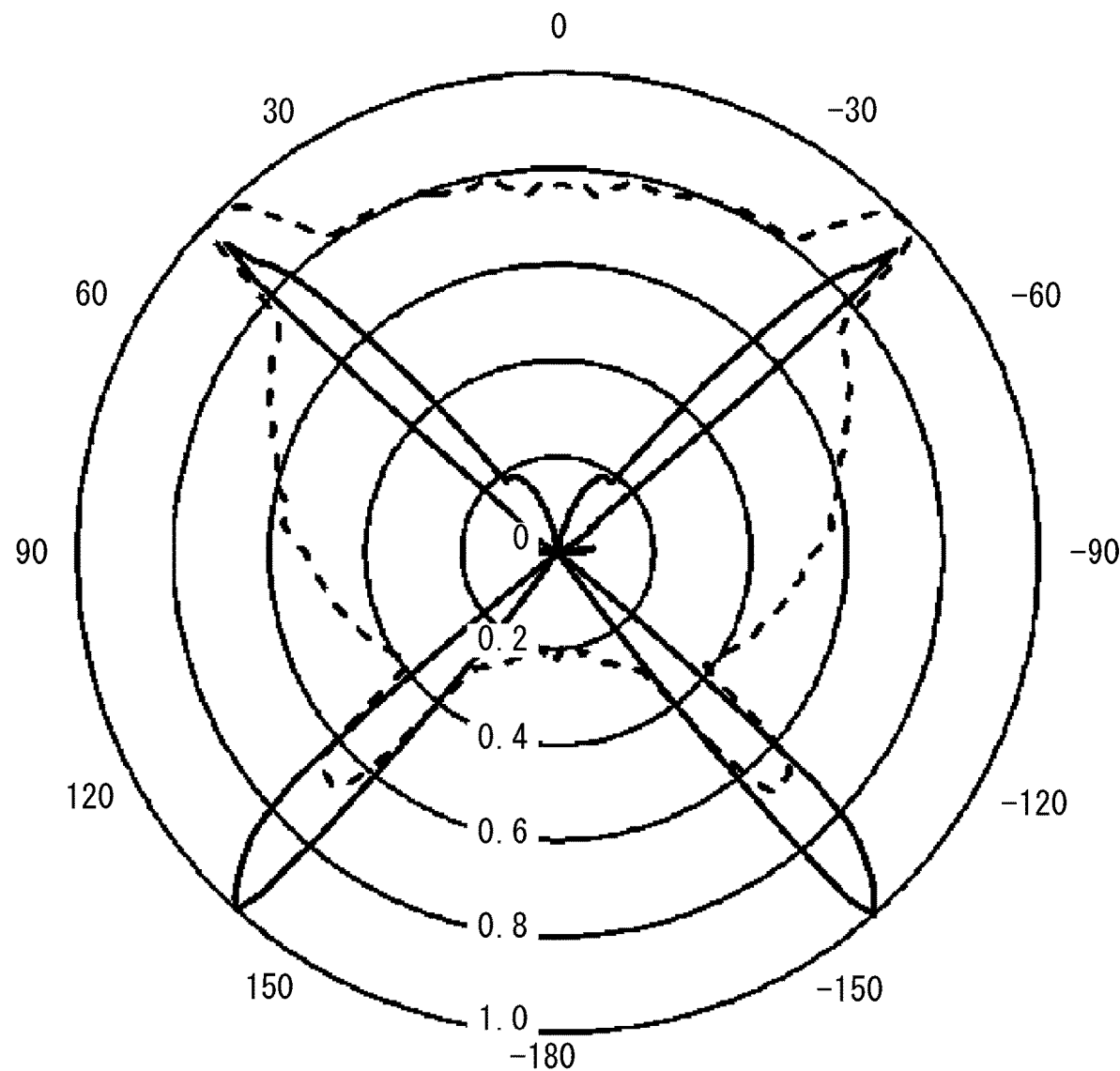
FIG. 9 is a graph illustrating light distribution characteristics of a light-emitting device and an illumination apparatus including the light flux controlling member according to Comparative example 2.
Figure 10:
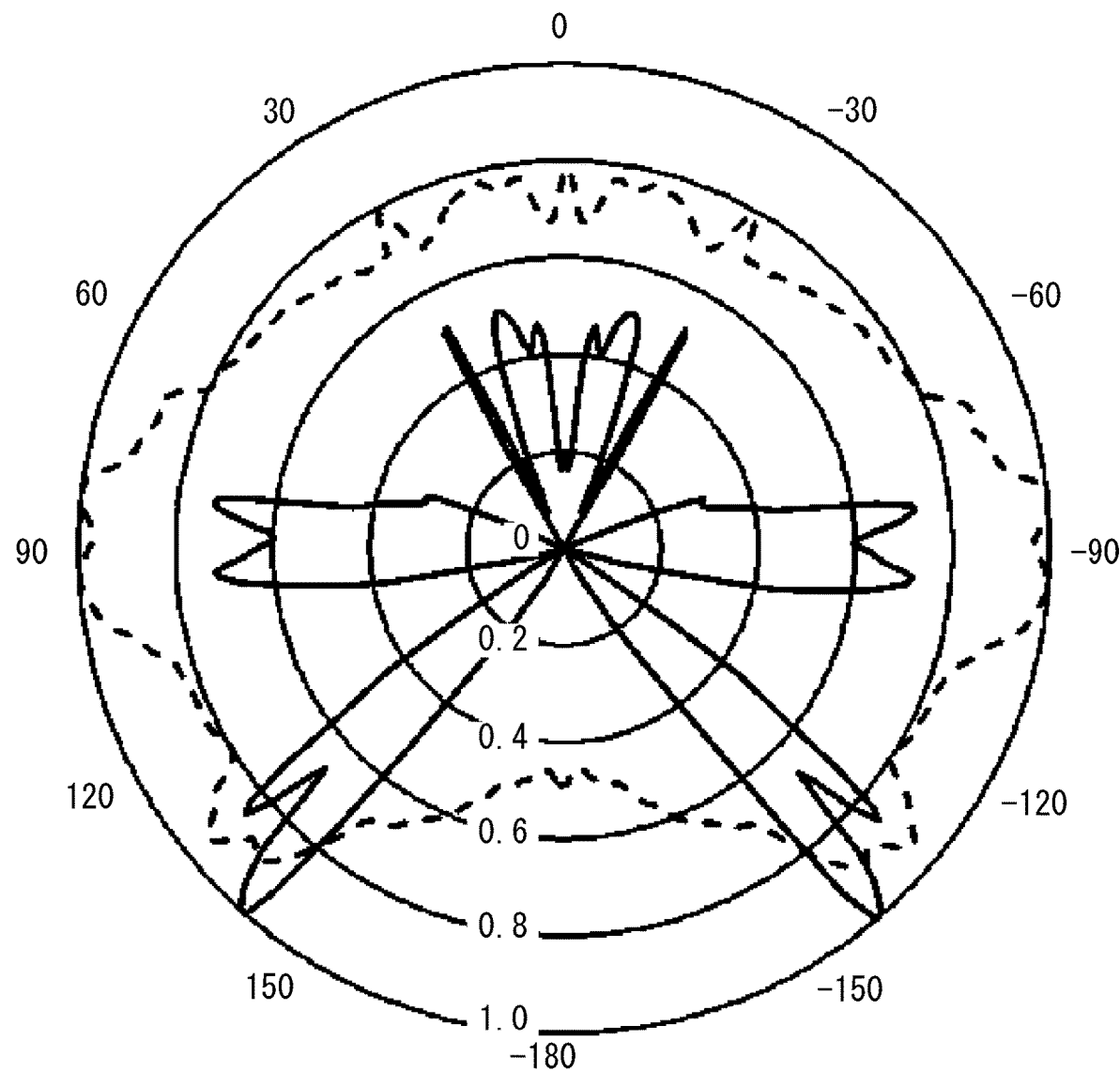
FIG. 10 is a graph illustrating light distribution characteristics of a light-emitting device and an illumination apparatus including the light flux controlling member according to Embodiment 1.

FIG. 8 to FIG. 10 are graphs illustrating light distribution characteristics of the light-emitting devices and the illumination apparatuses according to Comparative example 1, Comparative example 2 and the present embodiment. The numerical values shown on the outside of each graph represent angles (°) with respect to the reference point. 0° represents the direction of optical axis OA (forward direction), 90° the horizontal direction (lateral direction), and 180° the rearward direction. In addition, the numerical values shown on the inside of each graph represent the relative illuminances (maximum value: 1) of respective directions. In each graph, the solid line indicates the result of the case (of the light-emitting device) where light-emitting element 110 and the light flux controlling member are combined, and the dotted line indicates the result of the case (of the illumination apparatus) where light-emitting element 110, the light flux controlling member, and cover 160 are combined.

FIG. 8 is a graph illustrating light distribution characteristics of the light-emitting device and the illumination apparatus in Comparative example 1. As illustrated in FIG. 8, it was confirmed that in the light-emitting device (solid line), the quantity of the light in the forward direction is small, and light in a direction of around ±140° is generated. One possible reason for this is that a large part of light emitted from light-emitting element 110 is controlled in the rearward direction with reflecting surface 222 of light flux controlling member 220. In addition, in the case of the illumination apparatus (dotted line) in which cover 160 is attached to the light-emitting device, non-uniformity of light was caused with a large quantity of light in a direction of around ±140°, while the quantity of the emission light in the forward direction and the lateral direction were uniform.

FIG. 9 is a graph illustrating light distribution characteristics of the light-emitting device and the illumination apparatus in Comparative example 2. As illustrated in FIG. 9, it was confirmed that in the light-emitting device (solid line) light in a direction of around ±50° is also generated in addition to the light in a direction of around ±140°. One possible reason for this is that the size (diameter) of incidence surface 321 of light flux controlling member 320 is small, and therefore the light incident on incidence surface 321 is reflected by emission surface 323 and emitted from reflecting surface 322. In addition, in the case of the illumination apparatus in which cover 160 is attached to the light-emitting device, non-uniformity of light was caused with a large quantity of light in a direction of around ±50° and a direction of around ±140°, while the quantity of the emission light in the lateral direction was uniform. That is, when downsized, light flux controlling member 220 of Comparative example 1 causes degradation in light distribution characteristics.

FIG. 10 is a graph illustrating light distribution characteristics of light-emitting device 140 and illumination apparatus 100 according to Embodiment 1. As illustrated in FIG. 10, it was confirmed that in the light-emitting device (solid line), light in the lateral direction and the rearward direction is also generated in addition to the light in the forward direction. One possible reason for this is that, mainly, rearward light is generated with second reflecting surface 123 and third reflecting surface 124 of light flux controlling member 120, while light is appropriately emitted in the forward direction and the lateral direction. In addition, it was confirmed that, in the case of illumination apparatus 100 (solid line) in which cover 160 is attached to light emitting device 140, non-uniformity of the light can be further reduced by equalizing the quantity of the emitted light in the forward direction, the lateral direction and the rearward direction. That is, although light flux controlling member 120 according to the present embodiment is smaller than light flux controlling member 320 according to Comparative example 2, light flux controlling member 120 according to the present embodiment can provide favorable light distribution balance.

(Modification)

Next, light flux controlling member 420 according to a modification of Embodiment 1 is described. Light flux controlling member 420 according to the modification of Embodiment 1 is different from light flux controlling member 120 according to Embodiment 1 only in the shapes of first incidence surface 421a and first reflecting surface 422. Therefore, the same components as those of light flux controlling member 120 are denoted with the same reference numerals, and the description thereof is omitted.

Figure 11A:
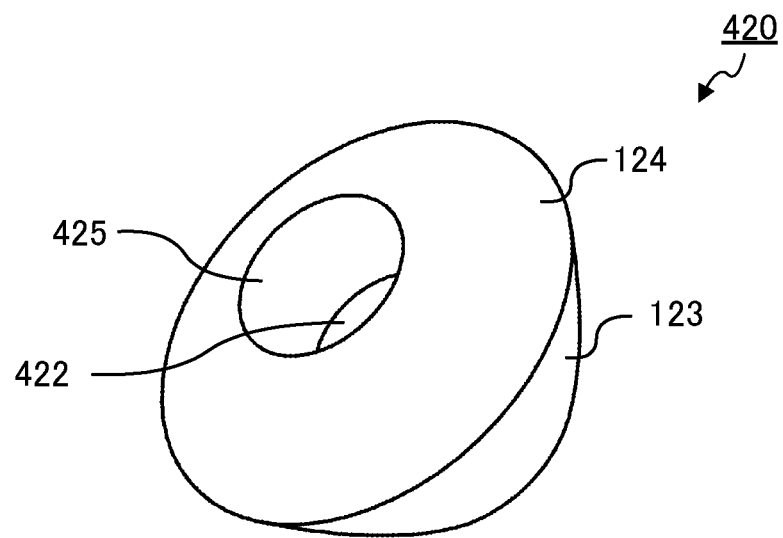
FIG. 11A and FIG. 11B are perspective views of a light flux controlling member according to a modification of Embodiment 1.
Figure 11B:
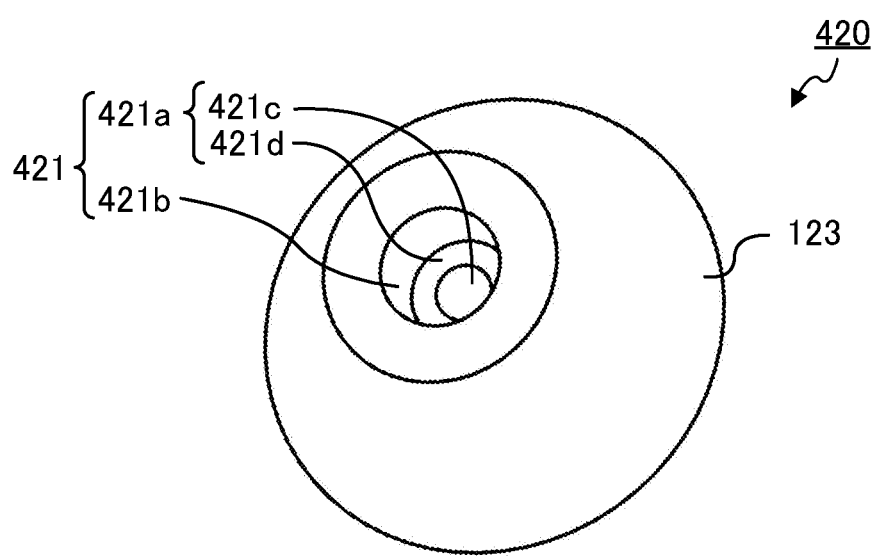
Figure 12A:
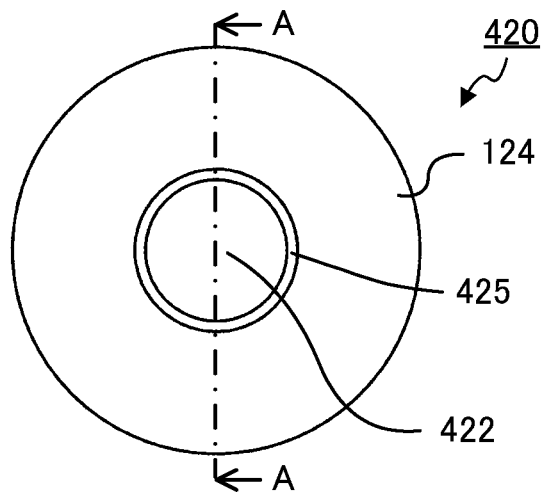
FIG. 12A to FIG. 12D illustrate a configuration of the light flux controlling member according to the modification of Embodiment 1.
Figure 12C:
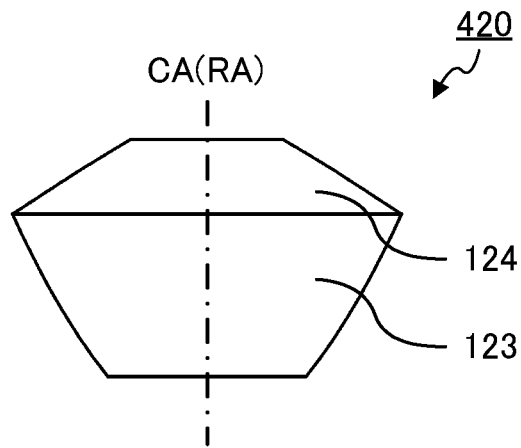
Figure 12B:
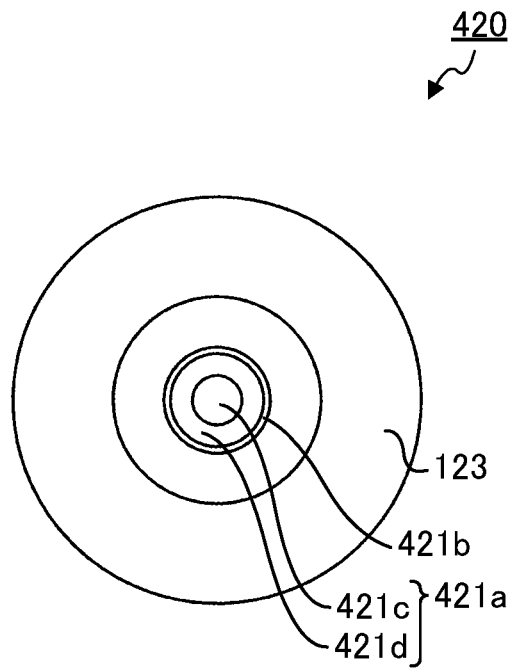
Figure 12D:
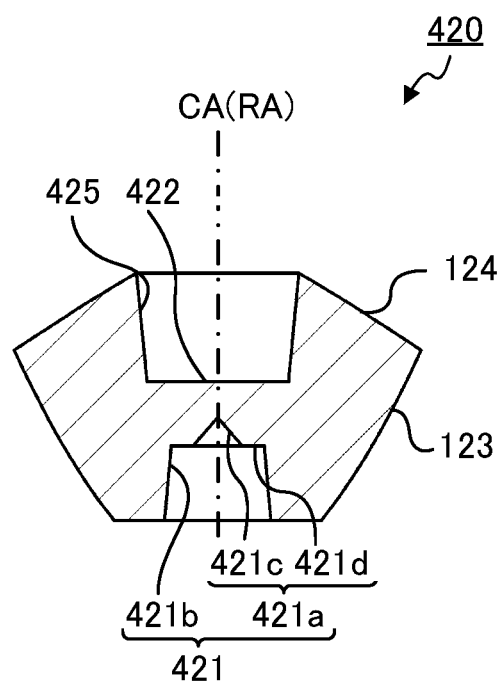

FIG. 11A and FIG. 11B are perspective views of light flux controlling member 420 according to the modification of Embodiment 1. FIG. 11A is a perspective view of light flux controlling member 420 as viewed from first reflecting surface 422 side, and FIG. 11B is a perspective view of light flux controlling member 420 as viewed from incidence region 421 side. In addition, FIG. 12A to FIG. 12D illustrate a configuration of light flux controlling member 420 according to the modification of Embodiment 1. FIG. 12A is a plan view of light flux controlling member 420 according to the modification of Embodiment 1, FIG. 12B is a bottom view of light flux controlling member 420, FIG. 12C is a side view of light flux controlling member 420, and FIG. 12D is a sectional view of light flux controlling member 420 taken along line A-A of FIG. 12A.

As illustrated in FIG. 11A to FIG. 12D, light flux controlling member 420 according to the modification of Embodiment 1 includes incidence region 421, first reflecting surface 422, second reflecting surface 123, third reflecting surface 124 and connection surface 425. In addition, incidence region 421 includes first incidence surface 421a and second incidence surface 421b. First incidence surface 421a includes first inner incidence surface 421c and first outer reflecting surface 421d.

First inner incidence surface 421c is so disposed as to intersect optical axis OA. First inner incidence surface 421c refracts, in a direction away from optical axis OA, light emitted from light-emitting element 110 with a small emission angle with respect to optical axis OA of light-emitting element 110, while allowing the light to enter light flux controlling member 420. First inner incidence surface 421c is formed such that as the distance thereof from optical axis OA increases, the distance thereof to the plane including the light-emitting surface of light-emitting element 110 decreases. In addition, the shape of first inner incidence surface 421c in the cross section including optical axis OA is not limited as long as the above-described condition is satisfied. In the present embodiment, the shape of first inner incidence surface 421c in the cross section including optical axis OA is a straight line. That is, first inner incidence surface 421c is formed in a shape of a side surface of a cone.

In the direction perpendicular to optical axis OA, first outer incidence surface 421d is disposed at a position distanced from optical axis OA in comparison with first inner incidence surface 421c. First outer incidence surface 421d refracts, in a direction away from optical axis OA, light emitted from light-emitting element 110 whose emission angle is larger than that of light which is to be incident on first inner incidence surface 421c and smaller than that of light which is to be incident on second incidence surface 421b, while allowing the light to enter light flux controlling member 420. The shape of first outer incidence surface 421d is not limited. The shape of first outer incidence surface 421d may be composed of a plane surface or a curved surface. In the present embodiment, the shape of first outer incidence surface 421d is a plane surface. In addition, first reflecting surface 422 is disposed in a direction orthogonal to optical axis OA.

Connection surface 425 is composed of one surface. In addition, the shape of connection surface 425 in the cross section including rotation axis RA is not limited. The shape of connection surface 425 in the cross section including rotation axis RA is a straight line. The inclination angle of connection surface 425 in the cross section including rotation axis RA is not limited. In addition, in the present embodiment, connection surface 425 is formed such that as the distance thereof from optical axis OA increases, the distance thereof to the plane including the light-emitting surface of light-emitting element 110 decreases. That is, in the present embodiment, connection surface 425 is slightly tilted with respect to rotation axis RA in consideration of the releasing in injection molding.

(Effect)

As described above, illumination apparatus 100 including light flux controlling member 120 or 420 according to the embodiment includes second reflecting surface 123 and third reflecting surface 124 for controlling light emitted from light-emitting element 110 even when light flux controlling members 120 and 420 are downsized, and thus can appropriately control the light to the rearward direction without upsizing light flux controlling members 120 and 420. Illumination apparatus 100 according to the present embodiment can provide light distribution characteristics yet closer to incandescent lamps in comparison with the conventional illumination apparatuses.

Embodiment 2

Next, illumination apparatus 500 according to Embodiment 2 is described. In Embodiment 2, an illumination apparatus which can be used in place of fluorescent lamps is described as a typical example of the illumination apparatus of the embodiment of the present invention.

(Configuration of Illumination Apparatus)

Figure 13:
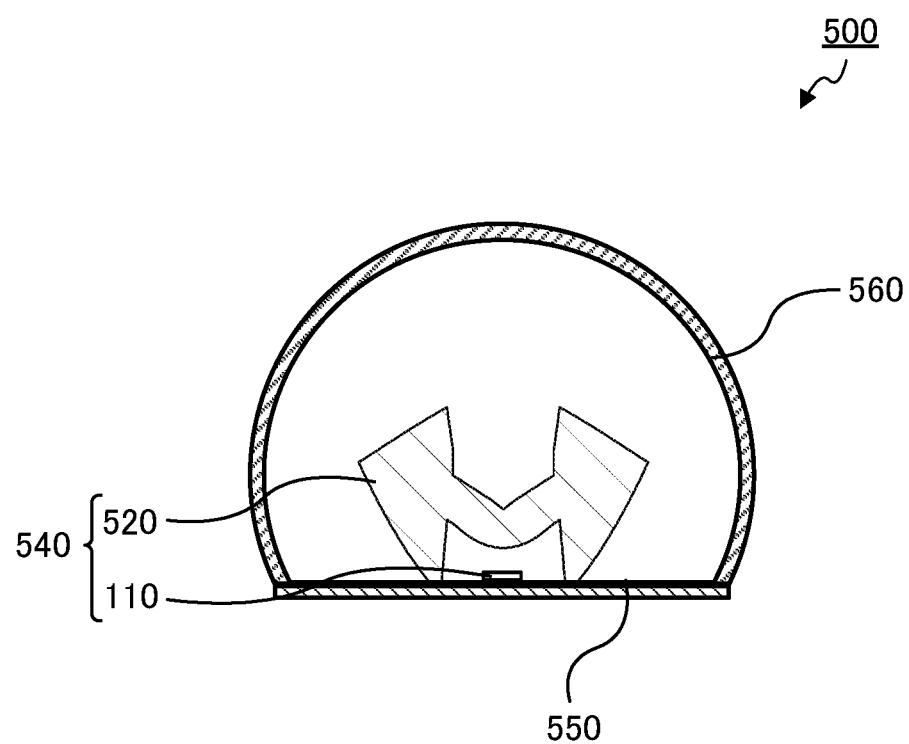
FIG. 13 is a sectional view of an illumination apparatus according to Embodiment 2.
Figure 14A:
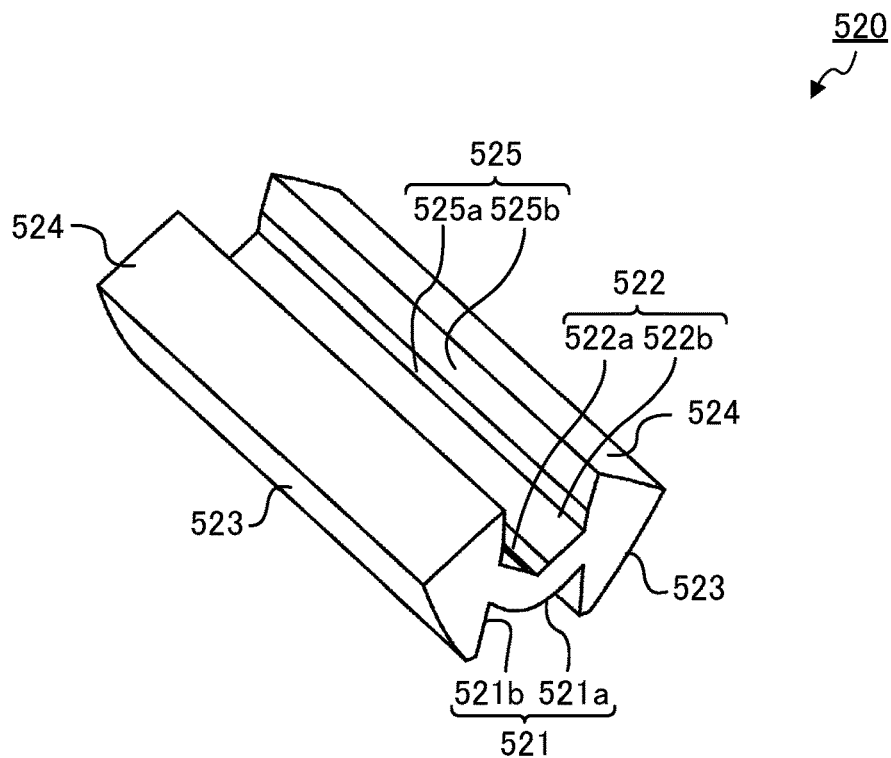
FIG. 14A and FIG. 14B are perspective views of a light flux controlling member according to Embodiment 2.
Figure 14B:
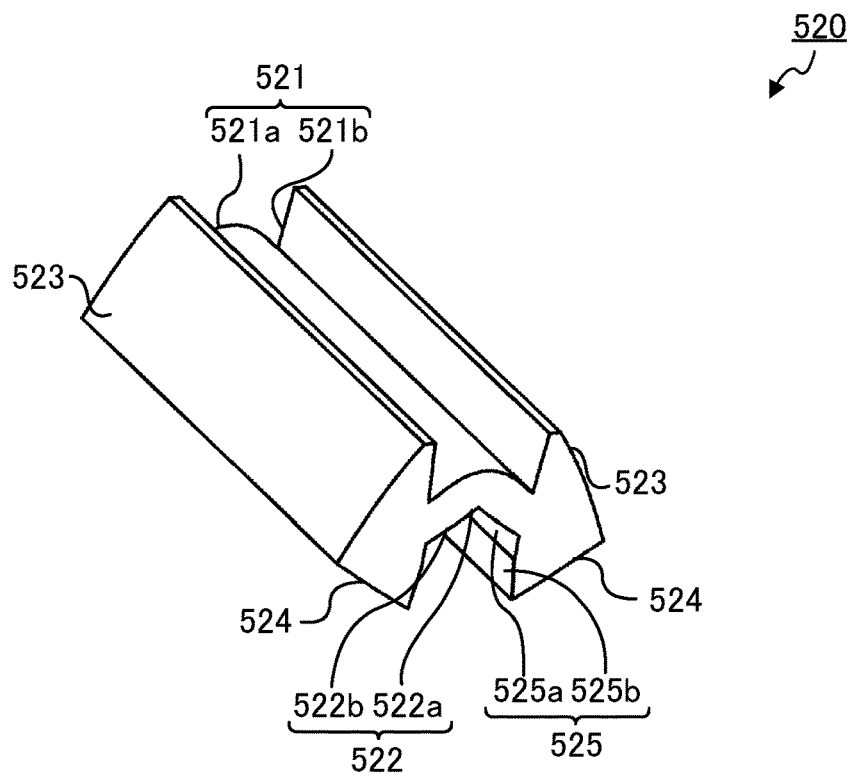
Figure 15A:
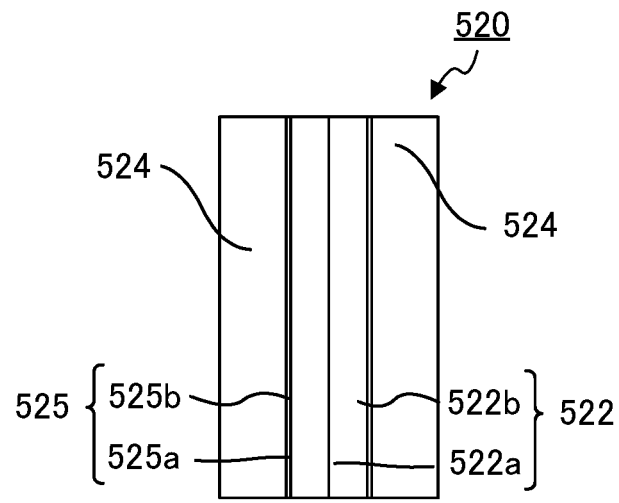
FIG. 15A to FIG. 15D illustrate a configuration of the light flux controlling member according to Embodiment 2.
Figure 15C:
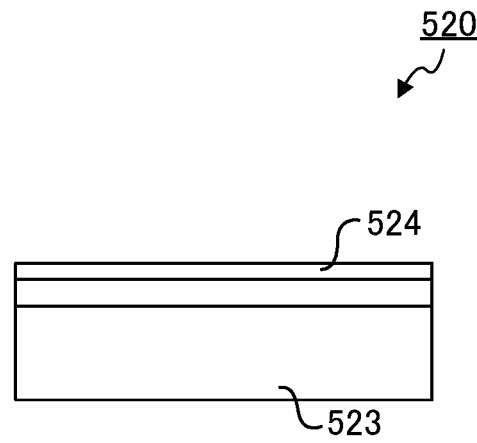
Figure 15B:
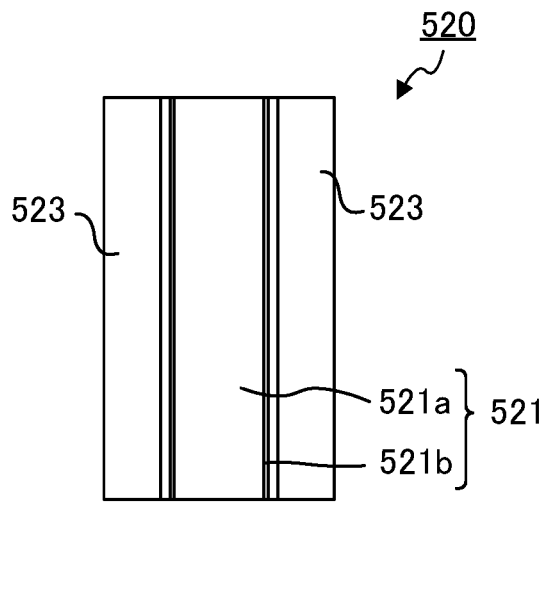
Figure 15D:
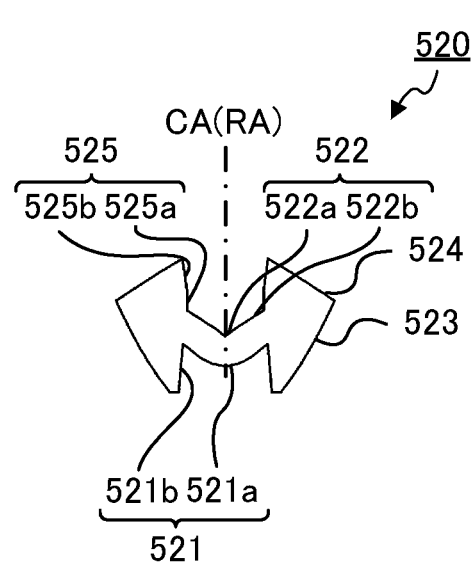

FIG. 13 is a sectional view of illumination apparatus 500 according to Embodiment 2 of the present invention. FIG. 14A to FIG. 15D illustrate a configuration of light flux controlling member 520 according to Embodiment 2. FIG. 14A is a perspective view of light flux controlling member 520 as viewed from first reflecting surface 522 side, and FIG. 14B is a perspective view of light flux controlling member 520 as viewed from incidence region 521 side. FIG. 15A is a plan view of light flux controlling member 520 according to Embodiment 2, FIG. 15B is a bottom view of light flux controlling member 520, FIG. 15C is a side view of light flux controlling member 520, and FIG. 15D is a front view of light flux controlling member 520.

As illustrated in FIG. 13, illumination apparatus 500 includes light-emitting device 540 including a plurality of light-emitting elements 110 and light flux controlling member 520, substrate 550, and cover 560.

Light-emitting element 110 is identical to that of illumination apparatus 100 according to Embodiment 1. In light-emitting device 540, a plurality of light-emitting elements 110 are disposed in a line on substrate 550. The number of light-emitting elements 110 in light-emitting device 540 is not limited as long as two or more light-emitting elements 110 are provided. Light flux controlling member 520 is formed in a columnar shape. Light-emitting device 540 is disposed on substrate 550. It is to be noted that light flux controlling member 520 is described later.

By cover 560, the light emitted from light flux controlling member 520 is transmitted to the outside while being diffused. Cover 560 is disposed to cover light-emitting device 540 with an air layer between cover 560 and light-emitting device 540. The external surface of cover 560 serves as an effective light emission region. The shape of cover 560 is not particularly limited as long as it can cover light-emitting device 540 with the air layer interposed between light-emitting device 540 and the cover 560. While cover 560 has a cylindrical form that is partially cut out in the example illustrated in FIG. 13, cover 560 may have a cylindrical form.

As illustrated in FIG. 14A to FIG. 15D, light flux controlling member 520 according to Embodiment 2 is formed in a columnar shape. Light flux controlling member 520 includes incidence region 521, first reflecting surface 522, second reflecting surface 523, third reflecting surface 524 and connection surface 525. Incidence region 521, first reflecting surface 522, second reflecting surface 523, third reflecting surface 524 and connection surface 525 extend in one direction orthogonal to optical axis OA of light-emitting element 110. Accordingly, each surface has no curvature in this direction (the arrangement direction of light-emitting elements 110). It is to be noted that, in the present embodiment, light flux controlling member 520 does not require the leg part. The reason for this is that light flux controlling member 520 extends in one direction orthogonal to optical axes OA of light-emitting elements 110, and thus has a gap for dissipating the heat generated from light-emitting elements 110 to the outside.

Incidence region 521 is disposed to face light-emitting elements 110. Incidence region 521 includes first incidence surface 521a and second incidence surface 521b. In addition, first reflecting surface 522 includes first inner reflecting surface 522a and first outer reflecting surface 522b. Further, connection surface 525 includes first connection surface 525a and second connection surface 525b.

The cross-sectional shape of incidence region 521, first reflecting surface 522, second reflecting surface 523, third reflecting surface 524 and connection surface 525 in the minor axis direction is identical to that of light flux controlling member 120 in Embodiment 1 in the cross section including rotation axis RA. In addition, the functions of incidence region 521, first reflecting surface 522, second reflecting surface 523, third reflecting surface 524 and connection surface 525 are identical to those of incidence region 121, first reflecting surface 122, second reflecting surface 123, third reflecting surface 124 and connection surface 125 of light flux controlling member 120 in Embodiment 1, respectively.

It is to be noted that, although not illustrated in the drawings, as in Embodiment 1, first incidence surface 521a may have a first inner incidence surface and a first outer reflecting surface. In this case, the functions of the first inner incidence surface and the first outer reflecting surface are identical to those of first inner incidence surface 421c and first outer reflecting surface 421d in Embodiment 1.
(Effect)

As described above, light flux controlling member 520 according to Embodiment 2 has an effect similar to that of light flux controlling member 120 according to Embodiment 1. Accordingly, in comparison with conventional illumination apparatus, illumination apparatus 500 according to the present embodiment can provide light distribution characteristics yet closer to fluorescent lamps.

This application is entitled to and claims the benefit of Japanese Patent Application No. 2015-129864 filed on Jun. 29, 2015, the disclosure each of which including the specification, drawings and abstract is incorporated herein by reference in its entirety.

INDUSTRIAL APPLICABILITY

The illumination apparatus including the light flux controlling member according to the embodiments of the present invention can be used in place of incandescent lamps or fluorescent lamps, and therefore can be widely applied to various kinds of illumination apparatuses such as chandeliers, fluorescent lamps, and indirect lighting apparatuses.

REFERENCE SIGNS LIST 100, 500 Illumination apparatus
110 Light-emitting element
120, 220, 320, 420, 520 Light flux controlling member
121, 421, 521 Incidence region
121a, 421a, 521a First incidence surface
121b, 421b, 521b Second incidence surface
122, 422, 522 First reflecting surface
122a, 522a First inner reflecting surface
122b, 522b First outer reflecting surface
123, 523 Second reflecting surface
124, 524 Third reflecting surface
125, 425, 525 Connection surface
125a, 525a First connection surface
125b, 525b Second connection surface
126 Leg part
127 First recess
140, 540 Light-emitting device
150, 550 Substrate
160, 560 Cover
170 Casing
221, 321 Incidence surface
222, 322 Reflecting surface
222a, 322a First reflecting surface
222b, 322b Second reflecting surface
223, 323, Emission surface
421c First inner incidence surface
421d First outer incidence surface
CA Rotation axis
OA Optical axis
RA Rotation axis

The invention claimed is:
1. A light flux controlling member configured to control a distribution of light emitted from a light-emitting element, the light flux controlling member being symmetrical about an optical axis of the light-emitting element in a cross section including the optical axis, the light flux controlling member comprising:
  an incidence region configured to be disposed to face the light-emitting element;
  a first reflecting surface disposed on a side opposite to the incidence region;
  a second reflecting surface disposed at a position distanced from the optical axis in comparison with the first reflecting surface in a direction perpendicular to the optical axis;
  a third reflecting surface disposed on a side opposite to the second reflecting surface in a direction along the optical axis; and
  a connection surface connecting the first reflecting surface and the third reflecting surface, wherein:
  the first reflecting surface and the second reflecting surface are separated from each other,
  the incidence region includes:
    a first incidence surface configured to be disposed to face the light-emitting element, and configured to allow incidence of light emitted from the light-emitting element with a small emission angle relative to the optical axis, and
    a second incidence surface disposed on the second reflecting surface side relative to the first incidence surface in the direction perpendicular to the optical axis, and configured to allow incidence of light emitted from the light-emitting element with a large emission angle relative to the optical axis;

in a cross section including the optical axis and a straight line extending along the direction perpendicular to the optical axis, a part of light emitted from the light-emitting element enters the light flux controlling member from the incidence region so as to be reflected by the first reflecting surface on a same side as the incidence region relative to the optical axis and to be emitted from the second reflecting surface on the same side as the incidence region relative to the optical axis;

in the cross-section, another part of the light emitted from the light-emitting element enters the light flux controlling member from the incidence region so as to be reflected by the second reflecting surface and the third reflecting surface in this order on a same side as the incidence region relative to the optical axis, before being emitted from the connection surface on the same side as the incidence region relative to the optical axis, and so as to thereafter re-enter the light flux controlling member from the first reflecting surface on a side opposite to the incidence region relative to the optical axis before being emitted from the second reflecting surface on the side opposite to the incidence region relative to the optical axis;

in the cross-section, light incident on the first incidence surface is reflected by the first reflecting surface on a same side as the first incidence surface relative to the optical axis, and is emitted from the second reflecting surface on the same side as the first incidence surface relative to the optical axis; and in the cross-section, light incident on the second incidence surface is reflected by the second reflecting surface and the third reflecting surface in this order on a same side as the second incidence surface relative to the optical axis before being emitted from the connection surface on the same side as the second incidence surface relative to the optical axis, so as to re-enter light flux controlling member from the first reflecting surface on a side opposite to the second incidence surface relative to the optical axis before being emitted from the second reflecting surface on the side opposite to the second incidence surface relative to the optical axis.

2. The light flux controlling member according to claim 1, wherein the first incidence surface and the first reflecting surface are formed such that as a distance thereof from the optical axis increases, a distance thereof from a plane including a light-emitting surface of the light-emitting element increases.

3. The light flux controlling member according to claim 1, wherein the first incidence surface includes:

a first inner incidence surface configured to be disposed to intersect the optical axis, the first inner incidence surface being formed such that as a distance thereof from the optical axis increases, a distance thereof to a plane including a light-emitting surface of the light-emitting element decreases; and a first outer incidence surface configured to be disposed at a position distanced from the optical axis in comparison with the first inside incidence surface in the direction perpendicular to the optical axis.

4. The light flux controlling member according to claim 1, wherein:

the second reflecting surface is formed such that as a distance thereof to the third reflecting surface decreases, a distance thereof from the optical axis increases; and the third reflecting surface is formed such that as a distance thereof to the second reflecting surface decreases, a distance thereof from the optical axis increases.

5. The light flux controlling member according to claim 1, wherein the incidence region, the first reflecting surface, the second reflecting surface, the third reflecting surface and the connection surface are rotationally symmetrical about an axis extending along the optical axis.

6. The light flux controlling member according to claim 1, wherein the incidence region, the first reflecting surface, the second reflecting surface, the third reflecting surface and the connection surface extend in a direction orthogonal to the optical axis.

7. A light-emitting device comprising:
a light-emitting element; and
the light flux controlling member according to claim 1, wherein
the light flux controlling member is disposed such that the incidence region faces the light-emitting element.

8. An illumination apparatus comprising:
the light-emitting device according to claim 7; and
a cover configured to allow light emitted from to the light-emitting device to pass the cover while diffusing the light.

* * * * *